United States Patent [19]

Tang et al.

[11] Patent Number: 5,329,179

[45] Date of Patent: Jul. 12, 1994

[54] ARRANGEMENT FOR PARALLEL PROGRAMMING OF IN-SYSTEM PROGRAMMABLE IC LOGICAL DEVICES

[75] Inventors: Howard Tang, San Jose, Calif.; Cyrus Tsui, Vancouver, Wash.

[73] Assignee: Lattice Semiconductor Corporation, Hillsboro, Oreg.

[21] Appl. No.: 957,311

[22] Filed: Oct. 5, 1992

[51] Int. Cl.[5] .......................................... H03K 19/177
[52] U.S. Cl. ..................................... 307/465; 307/243
[58] Field of Search .............................. 307/465–469, 307/243; 364/716

[56] References Cited

U.S. PATENT DOCUMENTS

| | | | |
|---|---|---|---|
| 4,758,985 | 7/1988 | Canter | 307/465 X |
| 4,858,178 | 8/1989 | Breuninger | 307/465 X |
| 4,866,508 | 9/1989 | Eichelberger et al. | 307/465 |
| 4,870,302 | 9/1989 | Freeman | 307/465.1 X |
| 4,876,466 | 10/1989 | Kondou et al. | 307/465 |
| 5,237,218 | 8/1993 | Josephson | 307/465 |

Primary Examiner—David R. Hudspeth
Attorney, Agent, or Firm—Skjerven, Morrill, MacPherson, Franklin & Friel

[57] ABSTRACT

A plurality of programmable logic devices are connected in parallel to a programming command generator. A device selector connects individual devices with the programming command generator, thereby permitting the individual devices to be programmed without routing the programming data through other devices. In an alternative embodiment, an identification code is used to place the individual device in a condition to receive programming data. Using the teachings of this invention, programming data may initially be entered into a plurality of devices, and then the data entered in all the devices may be used to program the devices simultaneously. This procedure requires less time than entering data and giving each device the execute command in sequence.

6 Claims, 9 Drawing Sheets

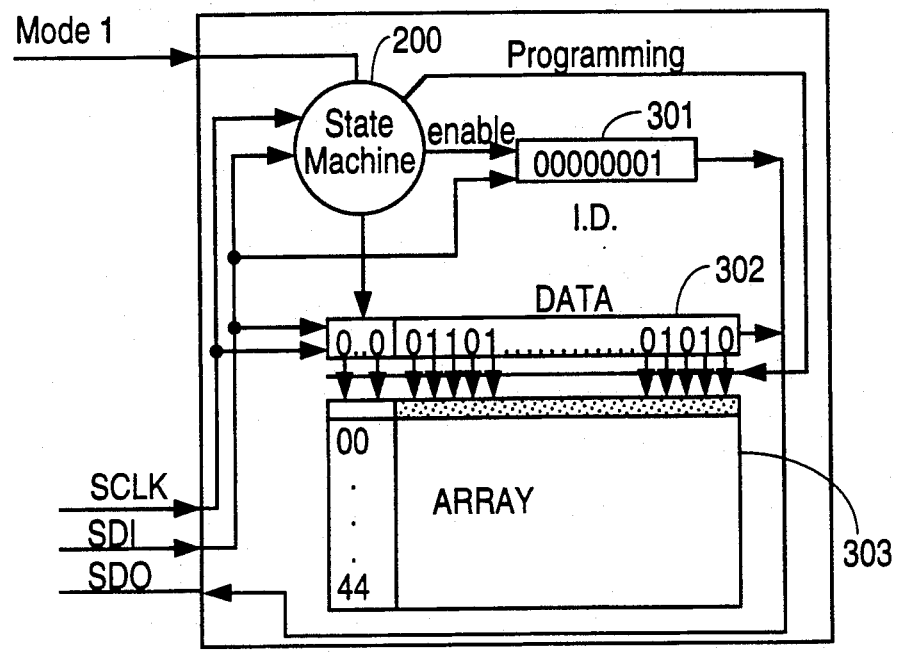
Fig. 3    ispDEVICE 1
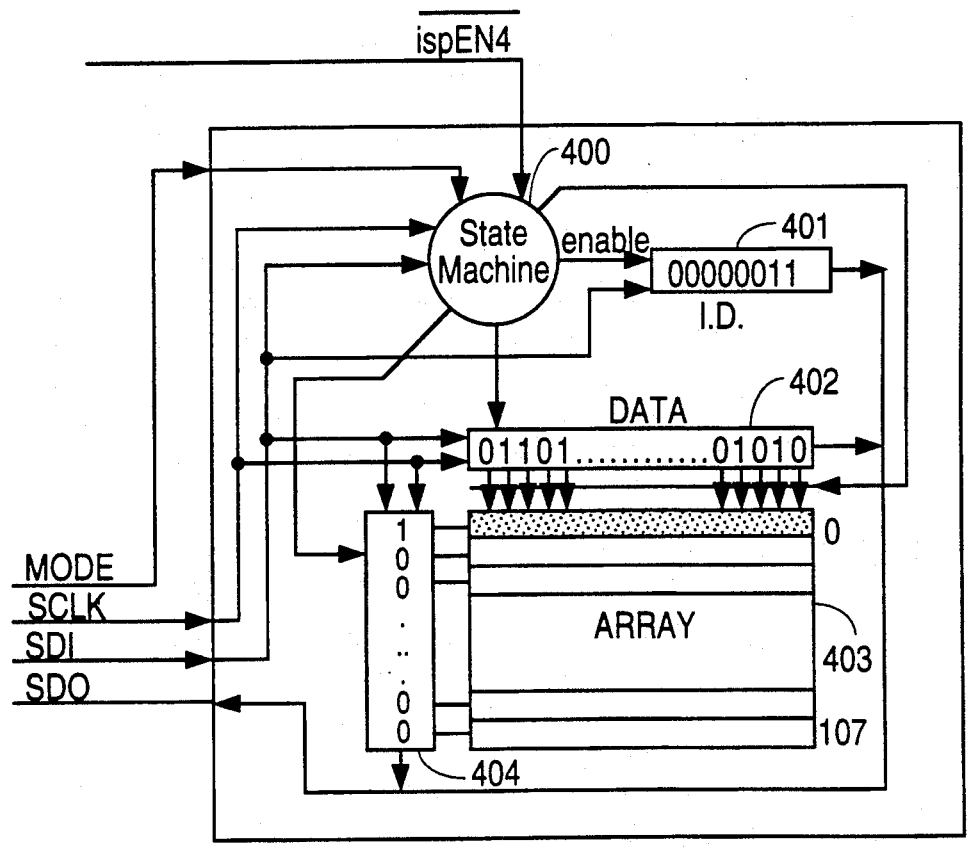
Fig. 4    ispDEVICE 4

ARRANGEMENT FOR PARALLEL PROGRAMMING OF IN-SYSTEM PROGRAMMABLE IC LOGICAL DEVICES

FIELD OF THE INVENTION

This invention relates to in-system programmable IC logic devices and, in particular, to a parallel arrangement for programming such devices.

BACKGROUND OF THE INVENTION

In-system programmable (ISP) logic devices offer the advantage that they may be programmed in place, without removing them from the system in which they are connected. This saves time and makes them particularly suitable for systems that are dynamically reconfigurable.

U.S. Pat. No. 4,870,302 illustrates (FIGS. 8A and 8B) two systems for programming a group of ISP devices. In each system, the ISP are connected in series, so that the programming data must be transferred through each device in the series before arriving at the intended destination device. Similarly, U.S. application Ser. No. 07/695,356, commonly owned and incorporated by reference herein, describes an arrangement for programming a group of ISP devices that are connected in series. These arrangements suffer from the disadvantage that the devices can only be programmed one at a time and that the data must often be routed through several devices before it reaches its destination.

SUMMARY OF THE INVENTION

In accordance with this invention, a programming command generator is connected in parallel with a group of ISP logic devices. A device selector is used to connect the programming command generator to a desired ISP device, thereby allowing the programming data to be delivered directly to that device without passing through intermediate devices. Several configurations for the device selector are described, including a demultiplexer, a state machine-controlled demultiplexer, a switch matrix, and a state machine-controlled switch matrix. These possibilities are not exhaustive, however; other equivalent arrangements will be apparent to those skilled in the art and are included within the broad principles of this invention.

Normally it takes longer to program an ISP logic device than it does to enter the programming data into the device. Accordingly, an advantage of this arrangement is that the programming data may first be read into each of the devices separately, and then all of the devices can be programmed simultaneously. This substantially reduces the amount of time required to program the devices.

In an alternative embodiment, the device selector is omitted and the device to be programmed is selected by transmitting an identification code unique to that device so as to establish communication between that device alone and the programming command generator.

The broad scope and varied possibilities of this invention will become apparent from the detailed description, which refers to the following drawings.

BRIEF DESCRIPTION OF THE DRAWINGS

FIG. 3 illustrates the general structure of an ISP device having four input signals.

FIG. 4 illustrates the general structure of an ISP device having five input signals.

DESCRIPTION OF THE INVENTION

This invention will be described by reference to two types of ISP logic devices, both of which are manufactured by the assignee of this application, Lattice Semiconductor Corporation.

The first of these devices is the ispGAL22V10, which has four programming pins: Mode, SCLK (Serial Clock), SDI (Serial Data In), and SDO (Serial Data Out). The device is placed in the programming mode by asserting the Mode signal high. Thereafter, the programming operation is controlled by the Mode and SDI pins. The structure and operation of this device are outlined below and are fully described in the ispGAL22V10 Programmer's Guide, available from Lattice Semiconductor Corporation, which is incorporated herein by reference.

The second device is the Lattice ispLSI. This device is programmed by using five pins, designated: ispEN(isp Enable), Mode, SCLK, SCI and SCO. This device is placed in the programming mode by asserting the ispEN pin low, which converts the other four pins from their normal functions to the programming mode. Thereafter, the programming is controlled by the Mode and SDI pins. The structure and operation of this device are outlined below and are fully described in the ispLSI Family Programming Spec., also available from Lattice Semiconductor Corporation and incorporated herein by reference.

This invention will be described with reference to six programmable logic devices. ISP devices 1, 2 and 3 are ispGAL22V10s and are therefore programmed using four pins, and ISP devices 4, 5 and 6 are ispLSIs and therefore are programmed using five pins.

Figure 1:
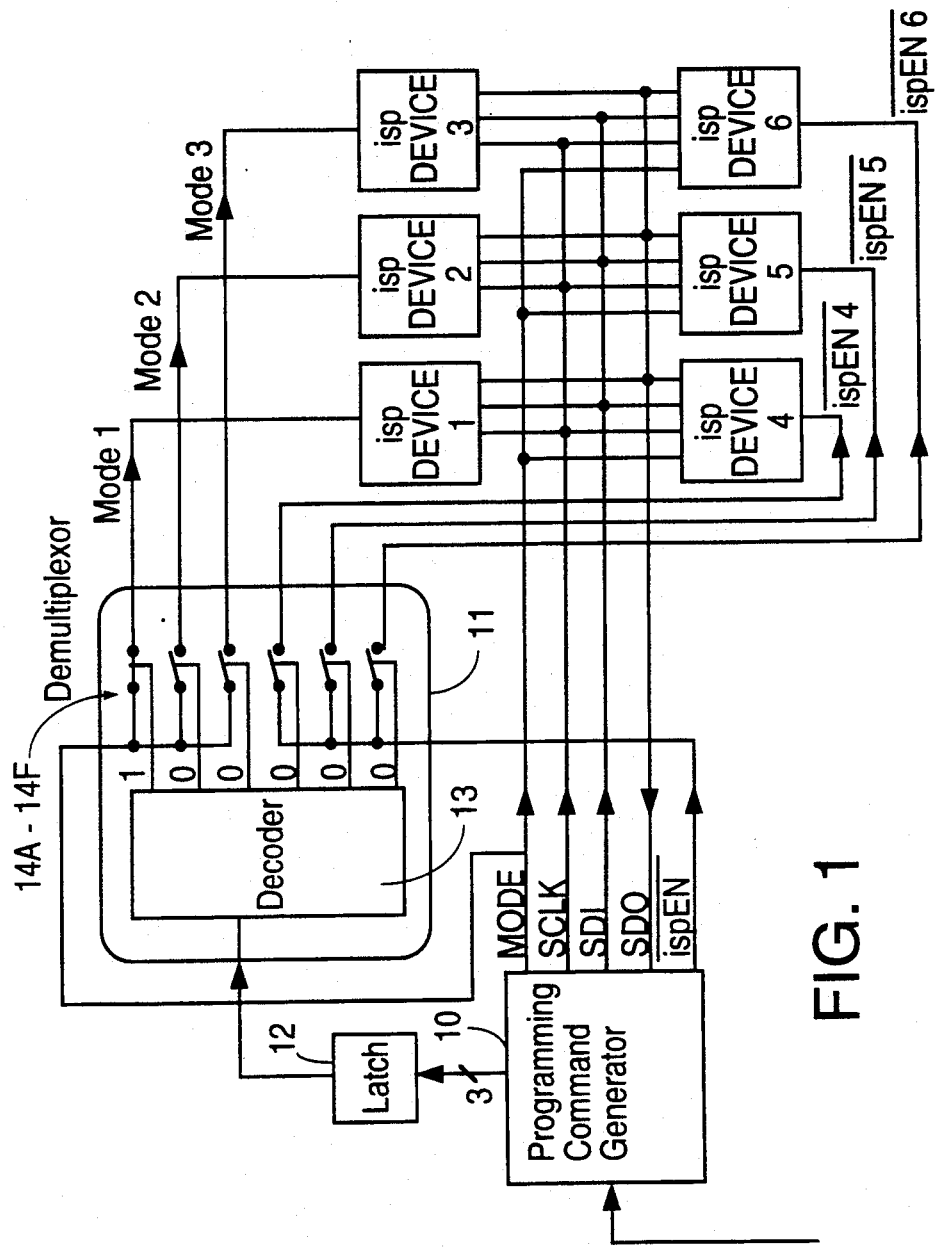
FIG. 1 illustrates a block diagram of an embodiment of the invention which includes a demultiplexer.

FIG. 1 illustrates an embodiment in which the device selector is a demultiplexer. A programming command generator 10 provides all of the signals necessary to program ISP devices 1-6 on lines designated Mode, SCLK, SDI, SDO and ispEN. Programming command generator 10 may, for example, be an IBM PC. A program suitable for programming command generator 10 is set forth at pp. 4-33 to 4-39 of the Lattice pLSI and ispLSI Data Book and Handbook (1992), available from Lattice Semiconductor Corp., which is incorporated herein by reference in its entirety. Programming command generator 10 is connected to a demultiplexer 11 via a latch 12, which holds a 3-bit word designating which of ISP devices 1-6 is to be addressed. Demultiplexer 11 contains a decoder 13 having six outputs which control respective switches 14A-14F. The Mode output of programming command generator 10 connects to one side of switches 14A-14C which in turn run to ISP devices 1-3. The $\overline{\text{ispEN}}$ output of programming command generator 10 is connected to one side of switches 14D-14F which in turn run to devices 4-6.

If, for example, ISP device 1 is to be addressed, programming command generator 10 outputs a 001 to latch 12, and decoder 13 generates an output closing switch 14A, which connects the Mode line to ISP device 1. When the programming of ISP device 1 has been completed, switch 14A is opened. If ISP device 4 is to be addressed, programming command generator 10 outputs a 100 to latch 12, and decoder 13 generates an output closing switch 14D, which connects the $\overline{\text{ispEN}}$ line to ISP device 4. When the programming of ISP device 4 has been completed, switch 14D is opened. Program command generator cannot communicate with those of ISP devices 1-6 which correspond to any of switches 14A-14F that are open, and thus they do not recognize the programming command.

Figure 2:
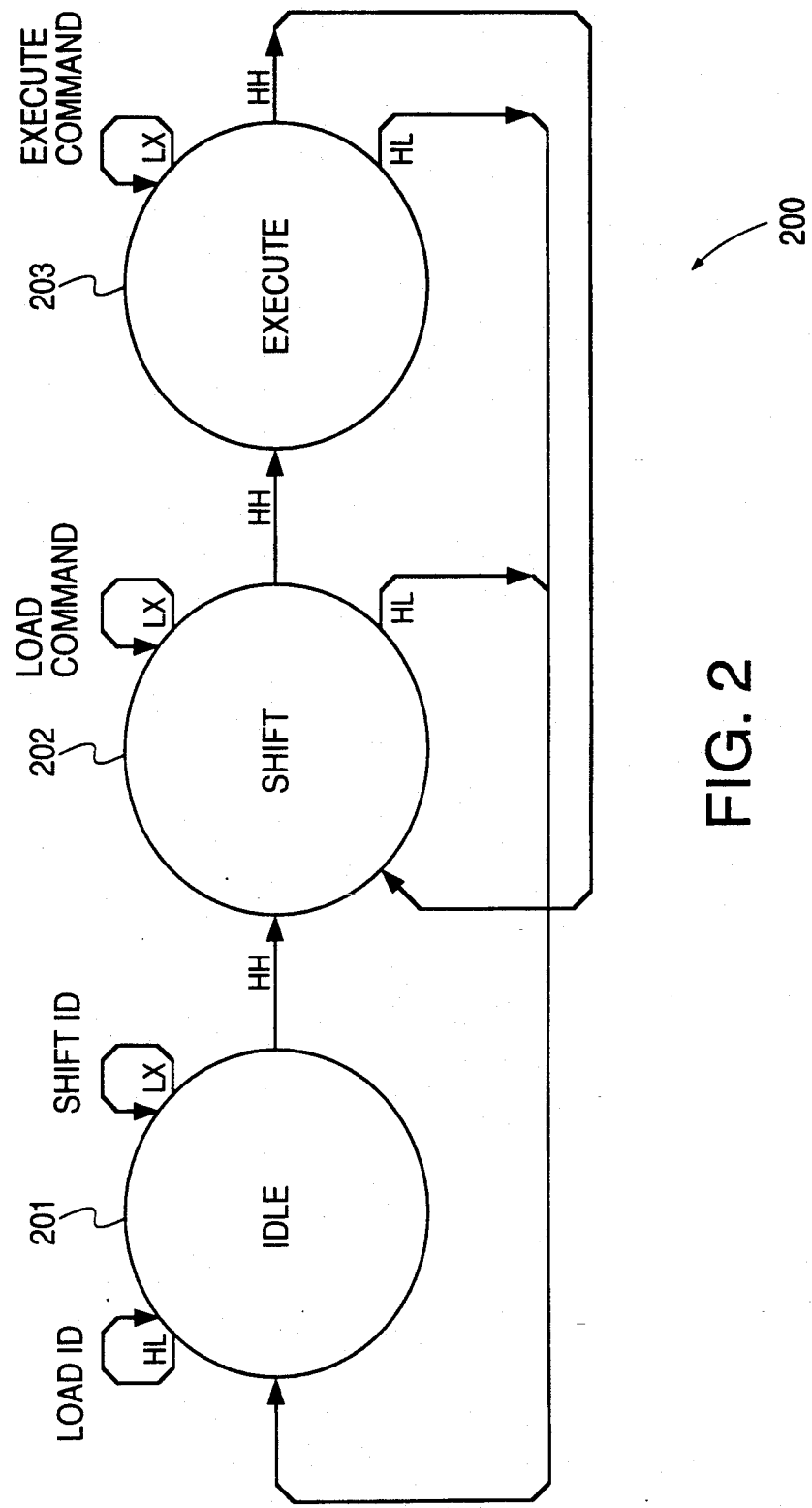
FIG. 2 illustrates a flow chart of the state machine in the ISP devices.

The structure and operation of ISP devices 1-3 will be illustrated by reference to FIGS. 2 and 3. FIG. 3 illustrates a block diagram of the internal interface to the ISP pins and the functional units involved in the programming operation. The programming operation is controlled by an instruction-based state machine 200 which is illustrated in FIG. 2. State machine 200 includes three states 201, 202 and 203, corresponding respectively to the idle, shift and execute states. Timing of state machine 200 is provided by the clock signal on the SCLK pin. The state of state machine 200 is determined by the signals on the Mode and SDI pins, and every state change is effective at the next clock pulse after a change in the Mode and SDI inputs. When the ISP device is functioning, state machine 200 stays locked in the idle state 201, which is unlocked when a high logic signal is received at the mode pin.

During the in-system programming mode, idle state 201 can be entered at any time from any state after one clock pulse by bringing the signal on the Mode pin to a logic high and the signal on the SDI pin to a logic low. A transition from the idle state 201 to the shift state 202, from the shift state to the execute state 203, or from the execute state 203 back to the shift state 202 can be accomplished by bringing both the Mode and the SDI pins to a logic high. When the Mode pin is at a logic low, the SDI pin is a data input pin, and the current state is held.

When the idle state 201 is entered, an 8-bit identification is automatically loaded into an ID register 301. The 8-bit identification specifies such parametric values as the number of logic blocks on the chip, the number of I/O pins available, etc. and is "hard wired" into the device. Then the Mode pin goes to a logic low, and seven clock pulses are applied to the SCLK pin to shift the identification in ID register 301 out the SDO pin to programming command generator 10 (the least significant bit of the identification already appears on the SDO pin). If programming command generator 10 recognizes the identification, communication is established with the ISP device.

As mentioned above, the shift state 202 is entered from the idle state 201 by bringing both the Mode and the SDI pins to a logic high. In the shift state 202, a 5-bit command is shifted serially into the ISP device via the SDI line. The command may be to erase data in the ISP device, send programming data to the ISP device, program the ISP device according to the data sent, extract programming data from the ISP device, or test the ISP device. Execution of the command is effected by bringing state machine 200 to the execute state 203, which is entered from the shift state 202 by bringing both the Mode and SDI pins to a logic high. Using 5-bit commands, 32 commands can be defined. The commands for device 4 are shown in Appendix A.

In the execute state 203, the command stored in the ISP device is executed. If the instruction is to load programming data into a data register 302 (i.e., the command "DATASHFT"), for example, the appropriate number of bits are shifted into data register 302 from the SDI pin after the Mode pin goes to a logic low, while the same number of bits in data register 302 are shifted out the SDO pin back to programming command generator 10. After the programming data have been shifted into register 302, a 5-bit command is issued to the ISP device by programming command generator 10 to transfer the programming data to row address 00 in a memory array 303. Array 303 contains a number of memory locations which correspond to programmable connections in the ISP device. After the data have been programmed to address 00, new programming data are sequentially shifted into register 302 and transferred to row address 01 of array 303. This process continues until all of addresses 00 through 44 are filled. Next, state machine 200 is stepped back to the command state 202 and the command to program the ISP device according to the data stored in array 303 is issued by programming command generator 10. The structure of ISP device 4 is illustrated in FIG. 4. State machine 400 is substantially identical to state machine 200 shown in FIG. 2. State machine 400 is activated when the $\overline{\text{ispEN}}$ is driven low, and its transitions from one state to another are controlled by the Mode and SDI pins. Initially state machine 400 is instructed to load into an ID register 401 an 8-bit identification which is then shifted out via the SDO line to programming command generator 10. If programming command generator 10 recognizes the identification, communication is established with ISP device 4. Programming command generator 10 then commands state machine 400 to shift the programming data into a data register 402 via the SDI line. State machine 400 is then commanded to shift row selection data into a row register 404. In FIG. 4, row 0 is selected. The programming data are then transferred from data register 402 to row 0 in a programmable array 403. This process is repeated until all of rows 0 through 107 are filled with programming data. The programmable connections in ISP device 4 are then programmed in accordance with the data stored in array 403.

Referring again to FIG. 1, it will be noticed that the SCLK, SDI and SDO outputs of programming command generator 10 are connected in common to ISP devices 1-3, while the Mode output is connected to ISP devices 1-3 via demultiplexer 11. The Mode, SCLK, SDI and SDO outputs of programming command generator 10 are connected in common to ISP devices 4-6, while the $\overline{\text{ispEN}}$ output is connected to ISP devices 4-6 via demultiplexer 11. As noted above, the respective state machines in ISP devices 1-3 are activated via the Mode pin, and the respective state machines in ISP devices 4-6 are activated via the $\overline{\text{ispEN}}$ pin.

Figure 5:
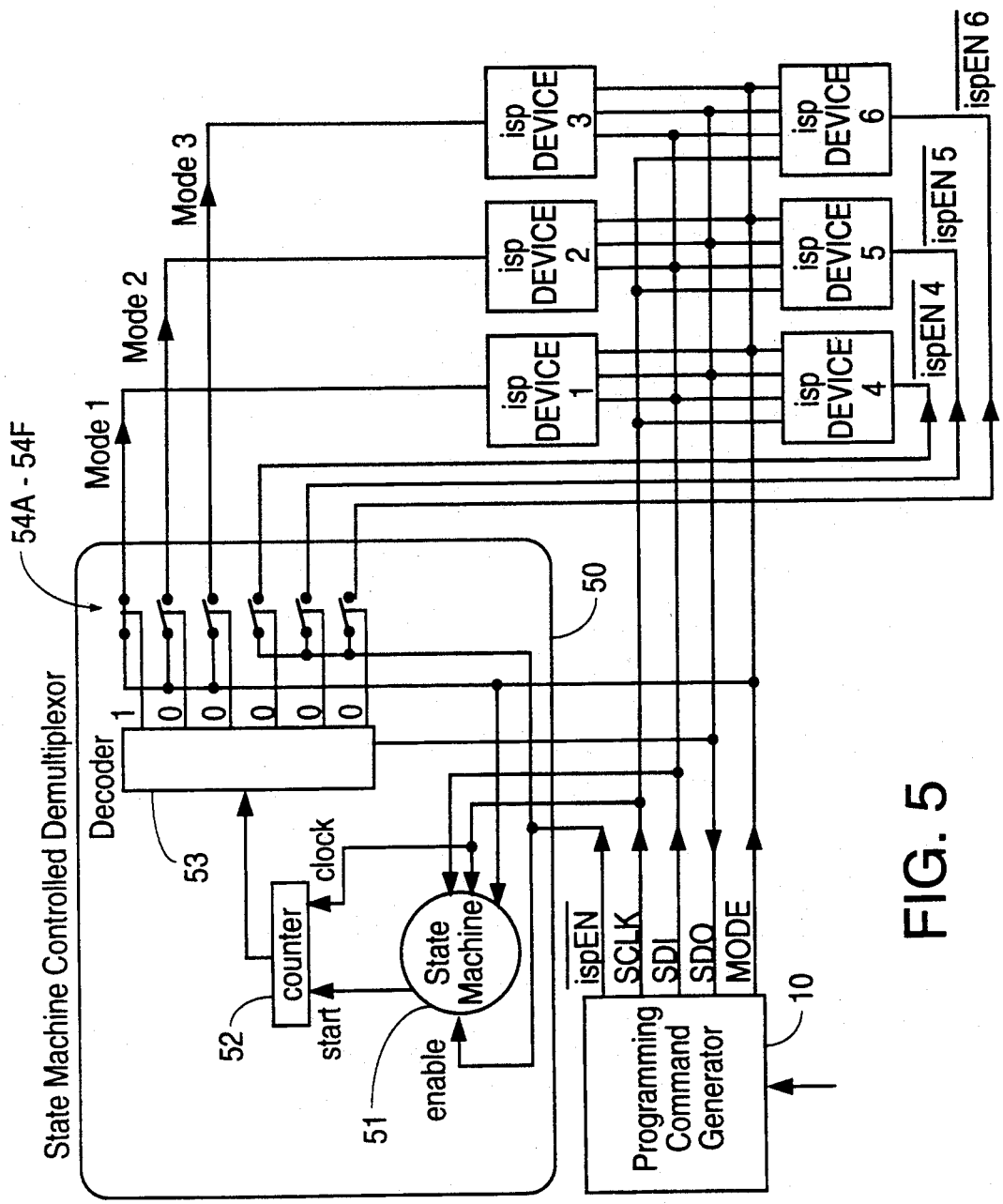
FIG. 5 illustrates a block diagram of an embodiment of the invention which includes a state machine-controlled demultiplexer.

In the embodiment of FIG. 5, a state machine-controlled demultiplexer 50 is connected between programming command generator 10 and ISP devices 1-6. State machine-controlled demultiplexer 50 contains a state machine 51, a counter 52, a decoder 53 and switches 54A-54F. The ispEN output of programming command generator 10 is connected to an input of state machine 50 and to one side of switches 54D-54F. The Mode output of programming command generator 10 is connected to another input of state machine 50 and to one side of switches 54A-54C. The SDI output of programming command generator 50 is connected to another input of state machine 50. Clock pulses are provided to state machine 50 and counter 52 via the SCLK output of programming command generator 10.

State machine 51 and counter 52 may advantageously reside in a Lattice GAL6001, the programming and structure of which are described in Appendix B and at pp. 2-147 to 2-161 of the Lattice GAL Data Book (1992), available from Lattice Semiconductor Corporation and incorporated herein by reference. The control signals for state machine 51 are Mode and SDI. Each GAL6001 device can support 7, ISP devices, since it includes a 3-bit counter. The 3-bit counters of several GAL6001 devices may be cascaded together to support as many ISP devices as required, as illustrated on page 17 of Appendix B.

Figure 6:
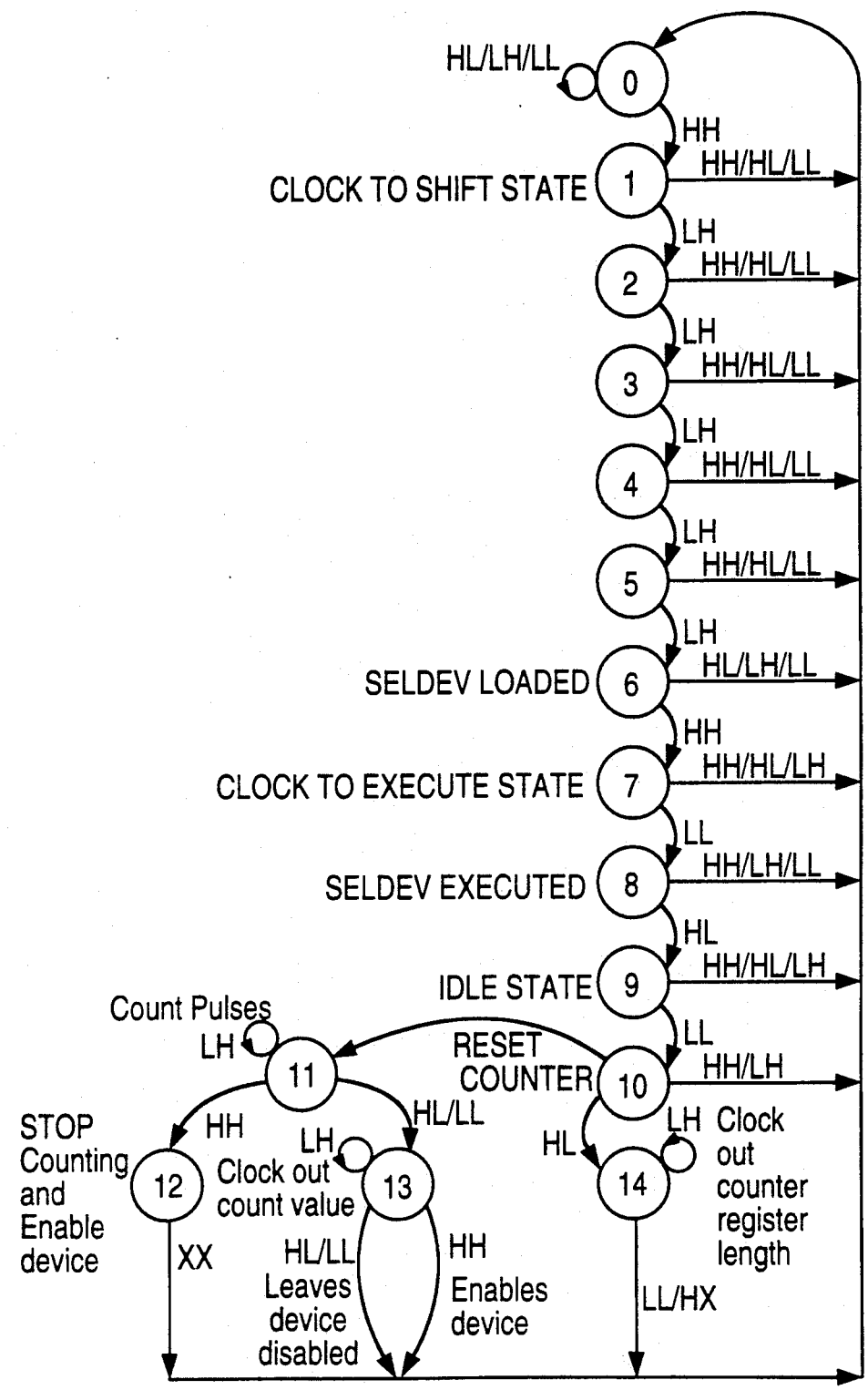
FIG. 6 illustrates a flow chart of the state machine in the state machine-controlled multiplexer of FIG. 5.

FIG. 6 illustrates a flow chart for state machine 51, which includes fourteen "states". Movement from one state to the next is controlled by the output of the SDI and Mode lines, and occurs with the clock pulses on the SCLK line. Since the SDI line is connected in common to state machine 51 as well as ISP devices 1-6, it is important to avoid issuing instructions to state machine 51 that would prompt any unwanted actions to be taken by ISP devices 1-6. This concern is accommodated by using the "no operation" command "00000" as a "wake-up" command for state machine 51 (see Appendix A).

State machine 51 is activated by bringing the ispEN line to a logic low, which places state machine 51 in state 0. The SDI and Mode lines are then brought to a logic high to move state machine 51 to state 1. This moves state machines 200 in ISP devices 103 and state machines 400 in ISP devices 4-6 to the "shift" state 202 (see FIG. 2). Thereafter, the SDI line is brought to a logic low for five consecutive clock pulses, bringing state machine 51 to state 6. ISP devices 1-6 interpret this as a "no operation" command 00000 while it serves as a "wake-up" command for state machine 51.

The SDI and Mode lines are then brought to a logic high, bringing state machine 51 to state 7 and the state machines in ISP devices 1-6 to the "execute" state 203. When the SDI and Mode lines are both brought low, state machine 51 moves to state 8, while the state machines in ISP devices 1-6 execute the command. Since the command was "no operation" however no action is taken as a result of this command. The SDI line is then brought high and the Mode line is brought low, moving state machine 51 to state 9, and moving the state machines in ISP devices 1-6 from the "execute" state to the "idle" state. This completes the "wake-up" cycle for state machine 51, and results in the state machines in ISP devices 1-6 being in the "idle" state. These state machines will remain in the "idle" state so long as a logic high does not appear on both the SDI and Mode lines.

The SDI and Mode lines are then both brought low, which resets counter 52 to zero. If the SDI and Mode lines remain low, state machine 51 proceeds to state 11. The Mode line is then brought to a logic high, and remains in this condition as programming command generator 10 delivers a number of clock pulses representative of the ISP device to be selected. Each of these clock pulses causes counter 52 to advance one binary word. For example, if ISP device 5 is to be selected, five clock pulses would be delivered to counter 52 leaving it in a "101" state. The binary word in counter 52 is reflected at all times in decoder 53, so that switches 54A, 54B, etc. are closed in succession as counter 52 steps forward. When the desired number is reached (i.e., the desired one of switches 54A-54F is closed) the SDI line is brought to a logic high and state machine 51 moves to state 12. This terminates the clocking of counter 52 and leaves the desired switch closed.

States 13 and 14 are optional features that are not required for programming the ISP devices. The use of state 13 allows the user to receive a visual reading of which ISP device has been selected. When state machine 51 arrives at state 11, the Mode line is brought low, moving state machine 51 to state 13. The SDI line is then brought low and the Mode line is brought high and counter 52 is pulsed as described above. At the same time, the user is given a visual indication of which device has been selected. If the visual indication indicates that the correct device has been selected, both the SDI and Mode lines are brought high, causing the device to be enabled. Otherwise, if the Mode line is brought low, the device remains disabled.

State 14 is used in the situation where more than seven ISP devices are being programmed. As noted above, since counter 52 is a 3-bit counter this requires that at least one additional counter be cascaded with counter 52. In this configuration, when state machine 51 reaches a "111" the next clock pulse would drive the second counter to a "001". Each time a counter fills up, a "1" appears on the line connecting it with the next cascaded counter, and in the case of the last counter on the SDO line. When state machine 51 is moved to state 14, programming command generator 10 counts the pulses delivered on the SCLK line while monitoring the SDO line. When a "1" appears on the SDO line, programming command generator 10 can determine the number of counters cascaded by dividing the number of pulses delivered by seven. This enables the user to determine how many counters are cascaded together.

Figure 7:
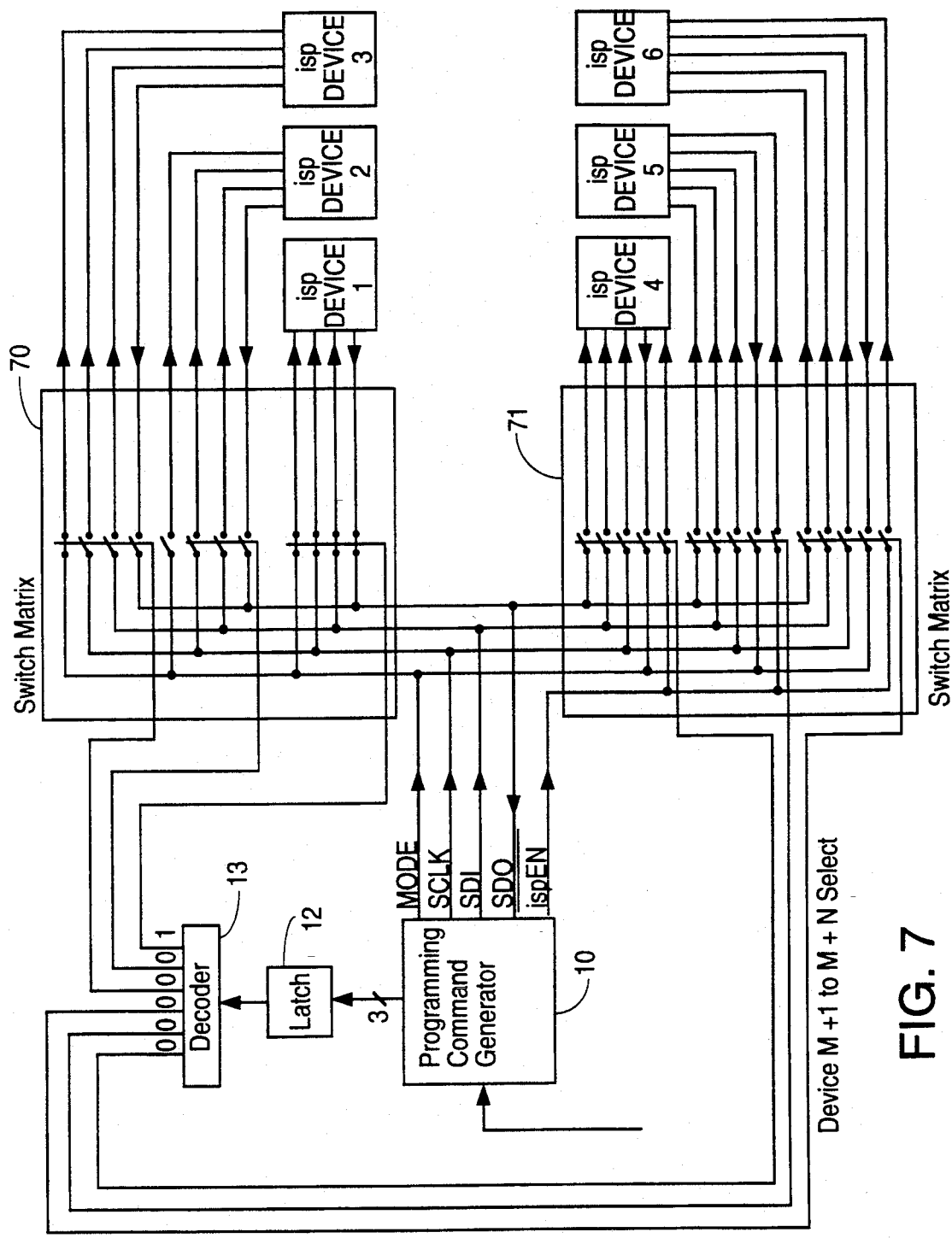
FIG. 7 illustrates a block diagram of an embodiment of the invention which includes a switch matrix.

FIG. 7 shows an embodiment including switch matrixes 70 and 71. Latch 12 and decoder 13 are identical to the similarly numbered components shown in FIG. 1. Three outputs of decoder 12 control switch groups in matrix 70, which connect the Mode, SCLK, SDI and SDO outputs to ISP devices 1-3, respectively. The remaining three outputs of decoder 13 control switch groups in switch matrix 71, and connect the Mode, SCLK, SDI, SDO and ispEN to ISP devices 4-6, respectively. As shown in FIG. 7, if the numeral 001 is delivered to latch 12, decoder 13 will close the switches connecting programming command generator 10 to ISP device 1. ISP Device 1 is then programmed as described above. Similarly, ISP devices 2-6 may be connected to programming command generator 10 and programmed.

Figure 8:
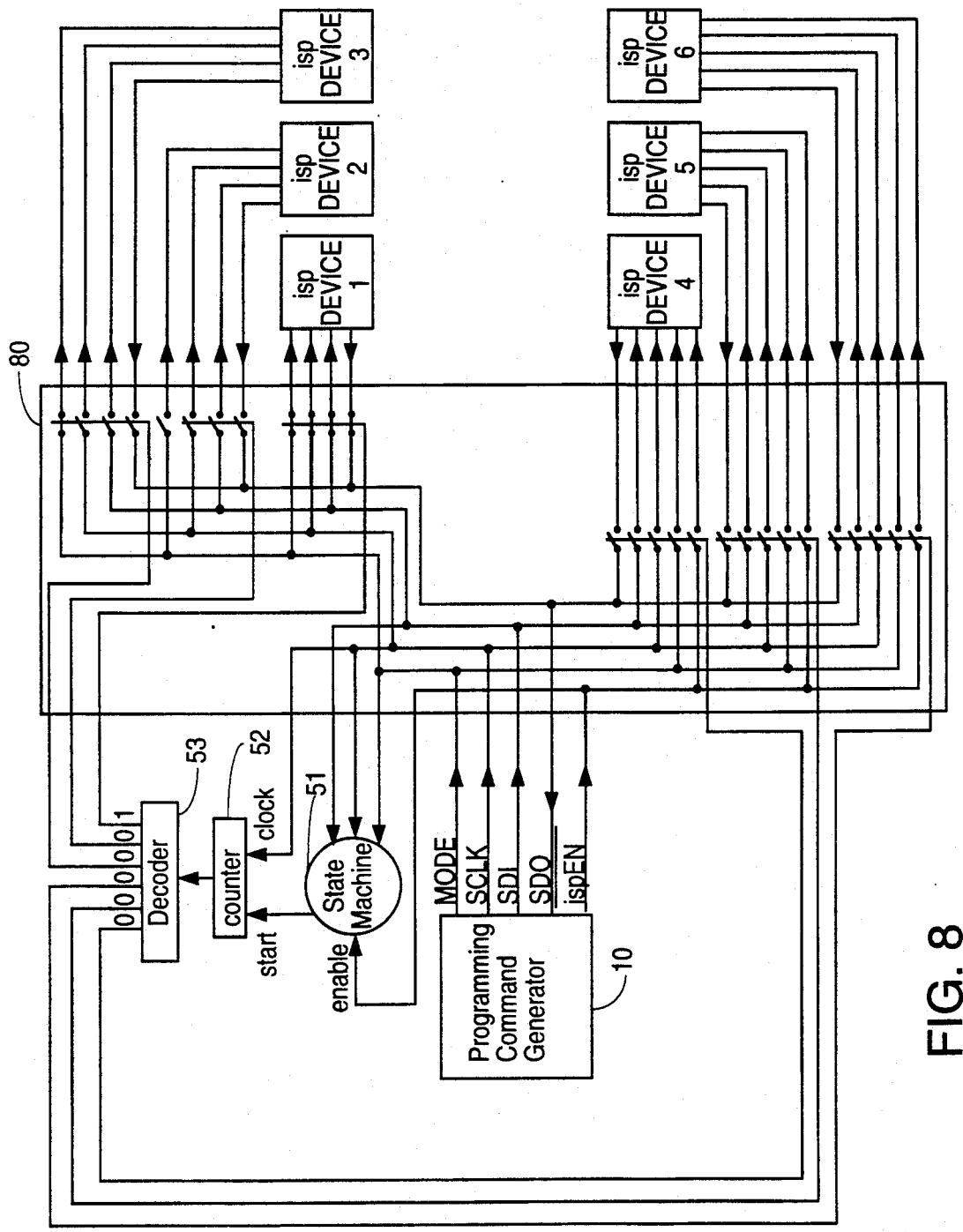
FIG. 8 illustrates a block diagram of an embodiment of the invention which includes a state machine-controlled switch matrix.

FIG. 8 illustrates yet another embodiment which includes a state machine controlled switch matrix 80. State machine 51, counter 52 and decoder 53 are identical to the similarly numbered components shown in FIG. 5. These devices function together in the same manner described above in connection with FIG. 5 to close the desired group of switches in switch matrix 80, thereby connecting the required output lines from programming command generator 10 to a desired one of ISP devices 1-6.

Figure 9A:
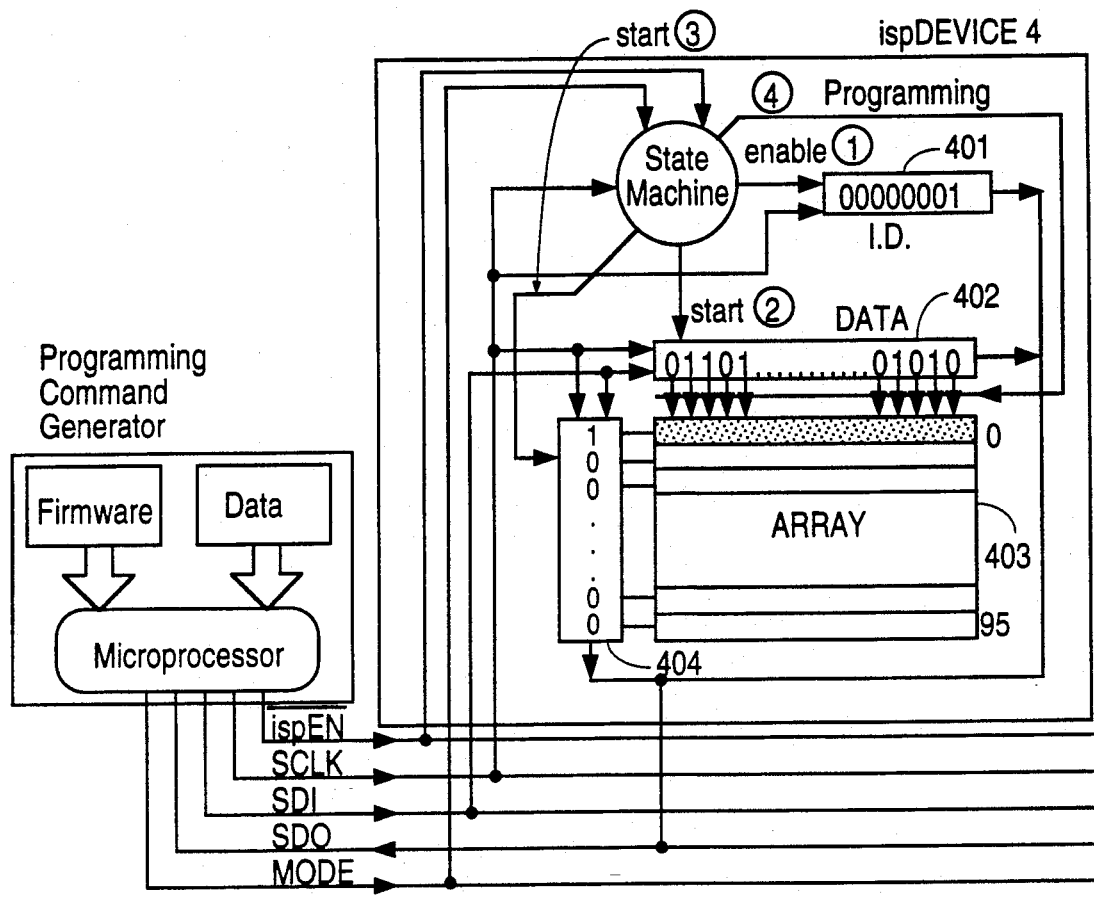
FIGS. 9, 9A and 9B illustrate a block diagram of an embodiment of the invention which does not include a device selector.
Figure 9:
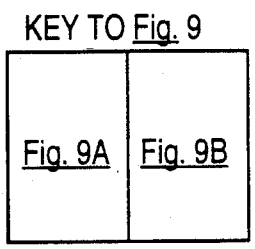
Figure 9B:
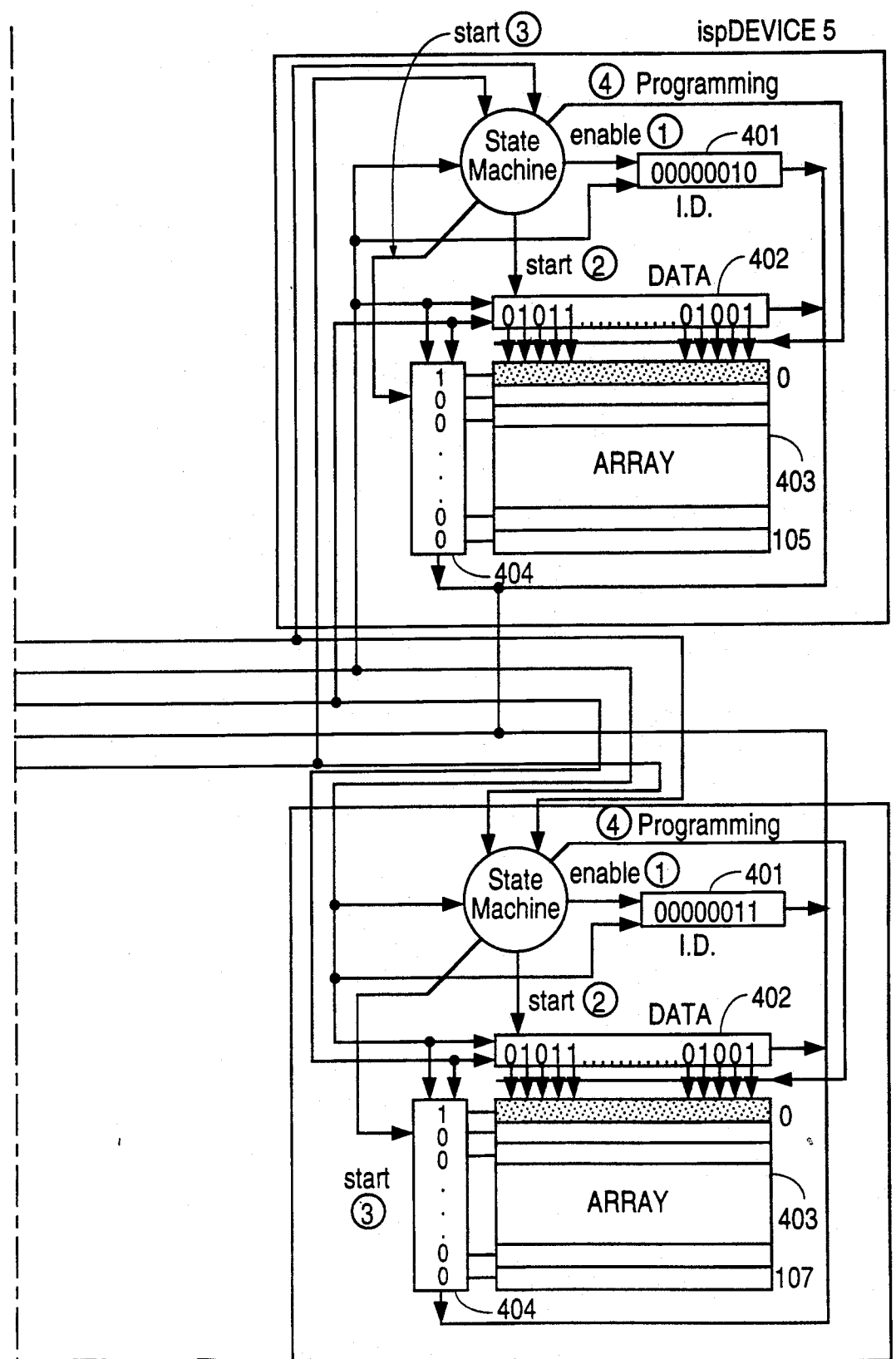

FIG. 9 illustrates another embodiment which omits the device selector. ISP devices 4–6 are shown connected to program command generator 10. Each of ISP devices 4–6 has a different 8-bit identification, the identification being "00000001" for ISP device 4, "00000010" for ISP device 5, and "00000011" for ISP device 6. Program command generator 10 drives the ispEN̄low, which results in the identification being loaded into the ID register 401 in each device.

Suppose ISP device 4 is to be programmed. Programming command generator 10 shifts the identification of ISP device 4 ("00000001") into the ID register 401 in each of the devices. A comparison means in each device compares the identification in ID register 401 with the permanently stored identification in the device, and as a result a match occurs only in ISP device 4. Therefore, communication is established only with ISP device 4 for data transfer from programming command generator 10, and ISP devices 5 and 6 are not activated for programming.

Programming command generator 10 then shifts the programming data into the data register 402 and the row address information into row register 404 of ISP device 4. Programming command generator 10 then drives the Mode pin high and the SDI pin low and pulses the SCLK pin. This loads the internally stored identification of each device into its respective ID register 401.

This process is then repeated except that the identification for ISP device 5 is shifted out of programming command generator 10 and programming data for one row are entered into ISP device 5. Similarly, the identification for ISP device 6 is entered into ID registers 401, and the programming data for one row are entered into ISP device 6. Programming command generator 10 then drives the Mode pin high and the SDI pin low and pulses the SCLK pin. This loads the internally stored identification of each device into its respective register 401. Programming command generator 10 then sends out the programming command. Since at the end of each entry of a row of programming data the internally stored identification is automatically loaded into the corresponding ID register 401, when the programming command is issued there is a match between the identification stored in ID register 401 and the permanently stored identification in each of ISP devices 4–6, and the command is executed for the data held in register 402 in each device. This process is continued until the respective programmable arrays 403 in devices 4–6 are completely programmed.

The embodiments described above have various advantages and disadvantages. The system which includes a demultiplexer (FIG. 1) uses a minimal traces on a circuit board and can support any mix of ISP devices. However, it does require the addition of a demultiplexer and additional trace circuitry is required to connect programming command generator 10 with latch 12.

The system which includes a state machine-controlled multiplexor (FIG. 5) requires minimal traces on a circuit board and can also support any mix of ISP devices. No additional traces are required to connect programming command generator 10 to state machine-controlled demultiplexer 50, and the programming time is minimized by programming all of the ISP devices simultaneously. However, this system requires a fairly complex IC for the state machine-controlled multiplexor.

The embodiments which include a switch matrix (FIGS. 7 and 8) require a greater number of traces on a printed circuit board.

The embodiment shown in FIG. 9 requires minimal traces on a circuit board, and no additional component such as a multiplexor is required. Moreover, programming time is minimized because all of the ISP devices can be programmed simultaneously. However, none of the ISP devices may have exactly the same identity.

The foregoing embodiments are intended to be illustrative only and not limiting. Additional embodiments will be apparent to those skilled in the art. For example, the embodiments shown in FIG. 9 can be combined with the other embodiments to program a group of ISP devices. All such additional embodiments are included within the broad scope of this invention, which is defined in the following claims.

APPENDIX A

| | | Operation | Code |
|---|---|---|---|
| 0. | NOP | No operation | 00000 |
| 1. | ADDSHFT | Address register shift | 00001 |
| 2. | DATASHFT | Data register shift | 00010 |
| 3. | GBE | Global bulk erase<br>Erase pia, array, architecture and security cells | 00011 |
| 4. | PIABE | PIA bulk erase<br>Erase pia cells | 00100 |
| 5. | ARRBE | Array bulk erase<br>Erase array cells | 00101 |
| 6. | ARCHBE | Architecture bulk erase<br>Erase architecture cells | 00110 |
| 7. | PROGEVEN | Program even columns<br>Program even columns of array, pia and architecture cells at the rows selected by Address SR | 00111 |

| | | | |
|---|---|---|---|
| 8. | PROGODD | Program odd columns<br>Program odd columns of array, pia and architecture cells at the rows selected by Address SR | 01000 |
| 9. | SFPRG | Program security cell | 01001 |
| 10. | VERIFYEVEN | Verify even columns programmed cells<br>Verify even columns of array, pia and architecture programmed cells. Only one row can be selected for each verification | 01010 |
| 11. | VERIFYODD | Verify odd columns programmed cells<br>Verify odd columns of array, pia and architecture programmed cells. Only one row can be selected for each verification | 01011 |
| 12. | GLCPRELD | Preload GLB registers | 01100 |
| 13. | IOPRELD | Preload I/O Cell registers | 01101 |
| 14. | FLOWTHRU | Flow through<br>SDI flow through to SDO | 01110 |
| 15. | PROGESR | Program ESR<br>Address SR is automatically cleared to 0 | 01111 |
| 16. | ERAALL | Erase all<br>Erase pia, array, architecture, ES and security cells | 10000 |
| 17. | VERESR | Verify ESR<br>Address SR is automatically cleared to 0 | 10001 |
| 18. | VEREVENH | Verify even columns erased cells<br>Verify even columns pia, array and architecture erased cells. Only one row can be selected for each verification | 10010 |
| 19. | VERODDH | Verify odd columns erased cells<br>Verify odd columns pia, array and architecture erased cells. Only one row can be selected for each verification | 10011 |
| 20. | NOP | No operation | 10100 |
| | | . . .<br>. . . | |
| 31. | INIT | Initialize | 11111 |

APPENDIX B

Programming and Connection of Lattice GAL 6001

Pages 1 to 6:

ABEL high level language design file to perform the logic function represented by the state machine shown in Fig. 6.

Pages 7 to 11:

ABEL document file generated by ABEL compiler available from Data I/O Corporation.

Pages 12 to 16:

JEDEC file used to implement the above-noted logic function.

Page 17:

Connections required to cascade two GAL 6001 devices together to support more than seven ISP devices.

```
isphw60            DEVICE    'f6001' ;

" control inputs

OCLK          pin 13 ;
  MODE          pin  1 ;
  SDIN          pin  2 ;
  ISPEN         pin  3 ;
  CAI           pin  4 ;
  M_ISP0        pin  5 ;
  M_ISP1        pin  6 ;
  M_ISP2        pin  7 ;
  M_ISP3        pin  8 ;
  M_ISP4        pin  9 ;
  M_ISP5        pin 10;
  M_ISP6        pin 11;
  LOOP_IN       pin 23;

" outputs

ISPEN0        pin 14;
  ISPEN1        pin 15;
  ISPEN2        pin 16;
  ISPEN3        pin 17;
  ISPEN4        pin 18;
  ISPEN5        pin 19;
  ISPEN6        pin 20;
  PROGEN        pin 21;
  CAO           pin 22;

" state registers

ST0           node 26   ;
  ST1           node 27   ;
  ST2           node 28   ;
  ST3           node 29   ;
  T_REG0        node 31 ;
  T_REG1        node 32 ;
  T_REG2        node 33 ;
  SHFT          node 30;

ISPEN0,ISPEN1,ISPEN2,ISPEN3          ISTYPE 'COM';
ISPEN4,ISPEN5,ISPEN6                 ISTYPE 'COM';
CAO                                  ISTYPE 'REG_G,INVERT,POS';
T_REG0,T_REG1,T_REG2                 ISTYPE 'REG_G,BUFFER,POS';
PROGEN                               ISTYPE 'REG_G,INVERT,NEG';

" Simulation Symbol Definitions

H = 1  ;
  L = 0  ;
  C = .C. ;
  X = .X. ;
  Z = .Z. ;
" State Bit Assignments

PSTATES = [ST3..ST0];

" Device Enable Counter

DCOUNT = [T_REG2,T_REG1,T_REG0];

EQUATIONS
  PSTATES.CLK=OCLK;
  DCOUNT.CLK=OCLK;
  CAO.CLK=OCLK;
  PROGEN.CLK=OCLK;

LOOP_IN.OE = 0;

ISPEN0 = (M_ISP0) ;
  ISPEN0.OE = (!ISPEN & !T_REG2 & !T_REG1 & T_REG0 & !PROGEN.FB);
```

```
ISPEN1 = (M_ISP1)  ;
ISPEN1.OE = (!ISPEN & !T_REG2 & T_REG1 & !T_REG0 & !PROGEN.FB);

ISPEN2 = (M_ISP2)  ;
ISPEN2.OE = (!ISPEN & !T_REG2 & T_REG1 & T_REG0 & !PROGEN.FB);

ISPEN3 = (M_ISP3)  ;
ISPEN3.OE = (!ISPEN & T_REG2 & !T_REG1 & !T_REG0 & !PROGEN.FB);

ISPEN4 = (M_ISP4)  ;
ISPEN4.OE = (!ISPEN & T_REG2 & !T_REG1 & T_REG0 & !PROGEN.FB);

ISPEN5 = (M_ISP5)  ;
ISPEN5.OE = (!ISPEN & T_REG2 & T_REG1 & !T_REG0 & !PROGEN.FB);

ISPEN6 = (M_ISP6)  ;
ISPEN6.OE = (!ISPEN & T_REG2 & T_REG1 & T_REG0 & !PROGEN.FB);

" Internal Counter Bit Equations

T_REG0.D = !T_REG0 & !(PSTATES==10) & CAO & !ISPEN & !SHFT;
T_REG0.CE = ((PSTATES==11) & !MODE & SDIN & !CAI
                      # (PSTATES==10)
                      # ISPEN);

T_REG1.D = !T_REG1 & !(PSTATES==10) & CAO & !ISPEN & !SHFT;
T_REG1.CE = ((PSTATES==11) & !MODE & SDIN & !CAI &
                      T_REG0
                      # (PSTATES==10)
                      # ISPEN);

T_REG2.D = !T_REG2 & !(PSTATES==10) & CAO & !ISPEN & !SHFT;
T_REG2.CE = ((PSTATES==11) & !MODE & SDIN & !CAI &
                      T_REG0 & T_REG1
                      # (PSTATES==10)
                      # ISPEN);

CAO.AR = ISPEN;

" State Machine Definition For isp MUX states

STATE_DIAGRAM PSTATES

STATE 0: if (MODE & SDIN
                      & !ISPEN) then   1 ;
              else                     0 ;

STATE 1: if (MODE & !SDIN
                      & !ISPEN) then   2 ;
              else                     0 ;

STATE 2: if (MODE & !SDIN
                      & !ISPEN) then   3 ;
              else                     0 ;

STATE 3: if (MODE & !SDIN
                      & !ISPEN) then   4 ;
              else                     0 ;

STATE 4: if (MODE & !SDIN
                      & !ISPEN) then   5 ;
              else                     0 ;

STATE 5: if (MODE & !SDIN
                      & !ISPEN) then   6 ;
              else                     0 ;

STATE 6: if (MODE & SDIN
                      & !ISPEN) then   7 ;
              else                     0 ;

STATE 7: if (!MODE & !SDIN
                      & !ISPEN) then   8 ;
              else                     0 ;
```

```
STATE 8:   if (MODE & !SDIN
                 & !ISPEN) then       9 ;
           else                       0 ;

STATE 9:   PROGEN.CE=1;
           CAO.CE=1;
           DCOUNT.CE=1;
           if (!MODE & !SDIN
                 & !ISPEN) then      10  with CAO.D=0;
                                              DCOUNT.D=0;
                                              PROGEN.D=0;
           else                       0 ;

STATE 10:  SHFT.CE=1;
           if (!MODE & !SDIN
                 & !ISPEN) then      11;
             else if (!MODE & SDIN
                 & !ISPEN) then      14 with SHFT.D=1;
           else                       0;

STATE 11:  CAO.CE=(DCOUNT==7) & !MODE & SDIN & !ISPEN;
           SHFT.CE=1;
           if (!MODE & SDIN
                 & !ISPEN) then      11 with CAO.D=(DCOUNT==7);
             else if (MODE & !SDIN
                 & !ISPEN) then 13 with SHFT.D=1;
             else if (!MODE & !SDIN
                 & !ISPEN) then 13 with SHFT.D=1;
           else if (MODE & SDIN
                 & !ISPEN) then      12;

STATE 12:  PROGEN.CE=1;
           GOTO 0 with PROGEN.D=CAO;

STATE 13:  CAO.CE=(!MODE & SDIN & !ISPEN);
           PROGEN.   =1;
           DCOUNT.CE=(!MODE & SDIN & !ISPEN);
           SHFT.CE=1;
           if (!MODE & SDIN
                 & !ISPEN) then 13 with CAO.D=!T_REG0.Q & SHFT;
                                        T_REG0.D=T_REG1.Q & SHFT;
                                        T_REG1.D=T_REG2.Q & SHFT;
                                        T_REG2.D=LOOP_IN & SHFT;
                                        SHFT.D=1;
           else if (MODE & SDIN
                 & !ISPEN)    then        0 with PROGEN.D=1;
                                                 SHFT.D=0;
           else                             0 with PROGEN.D=0;
                                                 SHFT.D=0;

STATE 14:  CAO.CE=(!MODE & SDIN & !ISPEN);
           DCOUNT.CE=(!MODE & SDIN & !ISPEN);
           SHFT.CE=1;
           if (!MODE & SDIN
                 & !ISPEN) then 14 with CAO.D=!T_REG0.Q & SHFT;
                                        T_REG0.D=T_REG1.Q & SHFT;
                                        T_REG1.D=T_REG2.Q & SHFT;
                                        T_REG2.D=!CAI & SHFT;
           else                    0 with SHFT.D=0;

TEST_VECTORS ([OCLK,ISPEN,MODE,SDIN,CAI,LOOP_IN,M_ISP0,M_ISP1,M_ISP2,M_ISP3,M_ISP4,M_ISP5,M_ISP
            [PSTATES,DCOUNT,CAO,ISPEN0,ISPEN1,ISPEN2,ISPEN3,ISPEN4,ISPEN5,ISPE1

" ISPEN0 ENABLE CHECK
 [ 0, 1, 0, 0, 0, 0, 0, 0, 0, 0, 0, 0, 0]->[ 0, 0, H, Z, Z, Z, Z, Z, Z, Z, H];
 [ C, 0, 1, 1, 0, 0, 0, 0, 0, 0, 0, 0, 0]->[ 1, 0, H, Z, Z, Z, Z, Z, Z, Z, H];
 [ C, 0, 1, 0, 0, 0, 0, 0, 0, 0, 0, 0, 0]->[ 2, 0, H, Z, Z, Z, Z, Z, Z, Z, H];
 [ C, 0, 1, 0, 0, 0, 0, 0, 0, 0, 0, 0, 0]->[ 3, 0, H, Z, Z, Z, Z, Z, Z, Z, H];
 [ C, 0, 1, 0, 0, 0, 0, 0, 0, 0, 0, 0, 0]->[ 4, 0, H, Z, Z, Z, Z, Z, Z, Z, H];
 [ C, 0, 1, 0, 0, 0, 0, 0, 0, 0, 0, 0, 0]->[ 5, 0, H, Z, Z, Z, Z, Z, Z, Z, H];
```

```
[ C, 0, 1, 0, 0, 0, 0, 0, 0, 0, 0, 0, 0]->[ 6, 0, H, Z, Z, Z, Z, Z, Z, Z, H];
[ C, 0, 1, 1, 0, 0, 0, 0, 0, 0, 0, 0, 0]->[ 7, 0, H, Z, Z, Z, Z, Z, Z, Z, H];
[ C, 0, 0, 0, 0, 0, 0, 0, 0, 0, 0, 0, 0]->[ 8, 0, H, Z, Z, Z, Z, Z, Z, Z, H];
[ C, 0, 1, 0, 0, 0, 0, 0, 0, 0, 0, 0, 0]->[ 9, 0, H, Z, Z, Z, Z, Z, Z, Z, H];
[ C, 0, 0, 0, 0, 0, 0, 0, 0, 0, 0, 0, 0]->[10, 0, H, Z, Z, Z, Z, Z, Z, Z, H];
[ C, 0, 0, 1, 0, 0, 0, 0, 0, 0, 0, 0, 0]->[11, 0, H, Z, Z, Z, Z, Z, Z, Z, H];
[ C, 0, 0, 1, 0, 0, 0, 0, 0, 0, 0, 0, 0]->[11, 1, H, Z, Z, Z, Z, Z, Z, Z, H];
[ C, 0, 1, 1, 0, 0, 0, 0, 0, 0, 0, 0, 0]->[12, 1, H, Z, Z, Z, Z, Z, Z, Z, H];
[ C, 0, 0, 1, 0, 0, 0, 0, 0, 0, 0, 0, 0]->[ 0, 1, H, L, Z, Z, Z, Z, Z, Z, L];
[ C, 0, 1, 1, 0, 0, 0, 0, 0, 0, 0, 0, 0]->[ 1, 1, H, L, Z, Z, Z, Z, Z, Z, L];
[ C, 0, 1, 0, 0, 0, 0, 0, 0, 0, 0, 0, 0]->[ 2, 1, H, L, Z, Z, Z, Z, Z, Z, L];
[ C, 0, 1, 0, 0, 0, 0, 0, 0, 0, 0, 0, 0]->[ 3, 1, H, L, Z, Z, Z, Z, Z, Z, L];
[ C, 0, 1, 0, 0, 0, 0, 0, 0, 0, 0, 0, 0]->[ 4, 1, H, L, Z, Z, Z, Z, Z, Z, L];
[ C, 0, 1, 0, 0, 0, 0, 0, 0, 0, 0, 0, 0]->[ 5, 1, H, L, Z, Z, Z, Z, Z, Z, L];
[ C, 0, 1, 0, 0, 0, 0, 0, 0, 0, 0, 0, 0]->[ 6, 1, H, L, Z, Z, Z, Z, Z, Z, L];
[ C, 0, 1, 1, 0, 0, 0, 0, 0, 0, 0, 0, 0]->[ 7, 1, H, L, Z, Z, Z, Z, Z, Z, L];
[ C, 0, 0, 0, 0, 0, 0, 0, 0, 0, 0, 0, 0]->[ 8, 1, H, L, Z, Z, Z, Z, Z, Z, L];
[ C, 0, 1, 0, 0, 0, 0, 0, 0, 0, 0, 0, 0]->[ 9, 1, H, L, Z, Z, Z, Z, Z, Z, L];
[ C, 0, 0, 0, 0, 0, 0, 0, 0, 0, 0, 0, 0]->[10, 0, H, Z, Z, Z, Z, Z, Z, Z, H];
" CARRY OUT CHECK
[ C, 0, 0, 1, 0, 0, 0, 0, 0, 0, 0, 0, 0]->[11, 0, H, Z, Z, Z, Z, Z, Z, Z, H];
[ C, 0, 0, 1, 0, 0, 0, 0, 0, 0, 0, 0, 0]->[11, 1, H, Z, Z, Z, Z, Z, Z, Z, H];
[ C, 0, 0, 1, 0, 0, 0, 0, 0, 0, 0, 0, 0]->[11, 2, H, Z, Z, Z, Z, Z, Z, Z, H];
[ C, 0, 0, 1, 0, 0, 0, 0, 0, 0, 0, 0, 0]->[11, 3, H, Z, Z, Z, Z, Z, Z, Z, H];
[ C, 0, 0, 1, 0, 0, 0, 0, 0, 0, 0, 0, 0]->[11, 4, H, Z, Z, Z, Z, Z, Z, Z, H];
[ C, 0, 0, 1, 0, 0, 0, 0, 0, 0, 0, 0, 0]->[11, 5, H, Z, Z, Z, Z, Z, Z, Z, H];
[ C, 0, 0, 1, 0, 0, 0, 0, 0, 0, 0, 0, 0]->[11, 6, H, Z, Z, Z, Z, Z, Z, Z, H];
[ C, 0, 0, 1, 0, 0, 0, 0, 0, 0, 0, 0, 0]->[11, 7, H, Z, Z, Z, Z, Z, Z, Z, H];
[ C, 0, 0, 1, 0, 0, 0, 0, 0, 0, 0, 0, 0]->[11, 0, L, _, Z, Z, Z, Z, Z, Z, H];
[ C, 0, 1, 1, 0, 0, 0, 0, 0, 0, 0, 0, 0]->[12, 0, L, Z, Z, Z, Z, Z, Z, Z, H];
[ C, 0, 0, 1, 0, 0, 0, 0, 0, 0, 0, 0, 0]->[ 0, 0, L, Z, Z, Z, Z, Z, Z, Z, H];
[ C, 0, 1, 1, 0, 0, 0, 0, 0, 0, 0, 0, 0]->[ 1, 0, L, Z, Z, Z, Z, Z, Z, Z, H];
[ C, 0, 1, 0, 0, 0, 0, 0, 0, 0, 0, 0, 0]->[ 2, 0, L, Z, Z, Z, Z, Z, Z, Z, H];
[ C, 0, 1, 0, 0, 0, 0, 0, 0, 0, 0, 0, 0]->[ 3, 0, L, Z, Z, Z, Z, Z, Z, Z, H];
[ C, 0, 1, 0, 0, 0, 0, 0, 0, 0, 0, 0, 0]->[ 4, 0, L, Z, Z, Z, Z, Z, Z, Z, H];
[ C, 0, 1, 0, 0, 0, 0, 0, 0, 0, 0, 0, 0]->[ 5, 0, L, Z, Z, Z, Z, Z, Z, Z, H];
[ C, 0, 1, 0, 0, 0, 0, 0, 0, 0, 0, 0, 0]->[ 6, 0, L, Z, Z, Z, Z, Z, Z, Z, H];
[ C, 0, 1, 1, 0, 0, 0, 0, 0, 0, 0, 0, 0]->[ 7, 0, L, Z, Z, Z, Z, Z, Z, Z, H];
[ C, 0, 0, 0, 0, 0, 0, 0, 0, 0, 0, 0, 0]->[ 8, 0, L, Z, Z, Z, Z, Z, Z, Z, H];
[ C, 0, 1, 0, 0, 0, 0, 0, 0, 0, 0, 0, 0]->[ 9, 0, L, Z, Z, Z, Z, Z, Z, Z, H];
[ C, 0, 0, 0, 0, 0, 0, 0, 0, 0, 0, 0, 0]->[10, 0, H, Z, Z, Z, Z, Z, Z, Z, H];
" ISPEN6 ENABLE CHECK
[ C, 0, 0, 1, 0, 0, 0, 0, 0, 0, 0, 0, 0]->[11, 0, H, Z, Z, Z, Z, Z, Z, Z, H];
[ C, 0, 0, 1, 0, 0, 0, 0, 0, 0, 0, 0, 0]->[11, 1, H, Z, Z, Z, Z, Z, Z, Z, H];
[ C, 0, 0, 1, 0, 0, 0, 0, 0, 0, 0, 0, 0]->[11, 2, H, Z, Z, Z, Z, Z, Z, Z, H];
[ C, 0, 0, 1, 0, 0, 0, 0, 0, 0, 0, 0, 0]->[11, 3, H, Z, Z, Z, Z, Z, Z, Z, H];
[ C, 0, 0, 1, 0, 0, 0, 0, 0, 0, 0, 0, 0]->[11, 4, H, Z, Z, Z, Z, Z, Z, Z, H];
[ C, 0, 0, 1, 0, 0, 0, 0, 0, 0, 0, 0, 0]->[11, 5, H, Z, Z, Z, Z, Z, Z, Z, H];
[ C, 0, 0, 1, 0, 0, 0, 0, 0, 0, 0, 0, 0]->[11, 6, H, Z, Z, Z, Z, Z, Z, Z, H];
[ C, 0, 0, 1, 0, 0, 0, 0, 0, 0, 0, 0, 0]->[11, 7, H, Z, Z, Z, Z, Z, Z, Z, H];
[ C, 0, 1, 1, 0, 0, 0, 0, 0, 0, 0, 0, 0]->[12, 7, H, Z, Z, Z, Z, Z, Z, Z, H];
[ C, 0, 0, 1, 0, 0, 0, 0, 0, 0, 0, 0, 0]->[ 0, 7, H, Z, Z, Z, Z, Z, Z, L, L];
[ C, 0, 1, 1, 0, 0, 0, 0, 0, 0, 0, 0, 0]->[ 1, 7, H, Z, Z, Z, Z, Z, Z, L, L];
[ C, 0, 1, 0, 0, 0, 0, 0, 0, 0, 0, 0, 0]->[ 2, 7, H, Z, Z, Z, Z, Z, Z, L, L];
[ C, 0, 1, 0, 0, 0, 0, 0, 0, 0, 0, 0, 0]->[ 3, 7, H, Z, Z, Z, Z, Z, Z, L, L];
[ C, 0, 1, 0, 0, 0, 0, 0, 0, 0, 0, 0, 0]->[ 4, 7, H, Z, Z, Z, Z, Z, Z, L, L];
[ C, 0, 1, 0, 0, 0, 0, 0, 0, 0, 0, 0, 0]->[ 5, 7, H, Z, Z, Z, Z, Z, Z, L, L];
[ C, 0, 1, 0, 0, 0, 0, 0, 0, 0, 0, 0, 0]->[ 6, 7, H, Z, Z, Z, Z, Z, Z, L, L];
[ C, 0, 1, 1, 0, 0, 0, 0, 0, 0, 0, 0, 0]->[ 7, 7, H, Z, Z, Z, Z, Z, Z, L, L];
[ C, 0, 0, 0, 0, 0, 0, 0, 0, 0, 0, 0, 0]->[ 8, 7, H, Z, Z, Z, Z, Z, Z, L, L];
[ C, 0, 1, 0, 0, 0, 0, 0, 0, 0, 0, 0, 0]->[ 9, 7, H, Z, Z, Z, Z, Z, Z, L, L];
[ C, 0, 0, 0, 0, 0, 0, 0, 0, 0, 0, 0, 0]->[10, 0, H, Z, Z, Z, Z, Z, Z, Z, H];
" DISABLE ISP MUX
[ 0, 1, 1, 1, 0, 0, 0, 0, 0, 0, 0, 0, 0]->[ 0, 0, H, Z, Z, Z, Z, Z, Z, Z, H];
[ 0, 1, 1, 1, 0, 0, 0, 0, 0, 0, 0, 0, 0]->[ 0, 0, H, Z, Z, Z, Z, Z, Z, Z, H];
" CHECK SERIAL SHIFT OUT FOR NUMBER OF MUX
[ C, 0, 1, 1, 0, 0, 0, 0, 0, 0, 0, 0, 0]->[ 1, 0, H, Z, Z, Z, Z, Z, Z, Z, H];
[ C, 0, 1, 0, 0, 0, 0, 0, 0, 0, 0, 0, 0]->[ 2, 0, H, Z, Z, Z, Z, Z, Z, Z, H];
[ C, 0, 1, 0, 0, 0, 0, 0, 0, 0, 0, 0, 0]->[ 3, 0, H, Z, Z, Z, Z, Z, Z, Z, H];
[ C, 0, 1, 0, 0, 0, 0, 0, 0, 0, 0, 0, 0]->[ 4, 0, H, Z, Z, Z, Z, Z, Z, Z, H];
[ C, 0, 1, 0, 0, 0, 0, 0, 0, 0, 0, 0, 0]->[ 5, 0, H, Z, Z, Z, Z, Z, Z, Z, H];
[ C, 0, 1, 0, 0, 0, 0, 0, 0, 0, 0, 0, 0]->[ 6, 0, H, Z, Z, Z, Z, Z, Z, Z, H];
[ C, 0, 1, 1, 0, 0, 0, 0, 0, 0, 0, 0, 0]->[ 7, 0, H, Z, Z, Z, Z, Z, Z, Z, H];
[ C, 0, 0, 0, 0, 0, 0, 0, 0, 0, 0, 0, 0]->[ 8, 0, H, Z, Z, Z, Z, Z, Z, Z, H];
[ C, 0, 1, 0, 0, 0, 0, 0, 0, 0, 0, 0, 0]->[ 9, 0, H, Z, Z, Z, Z, Z, Z, Z, H];
```

```
[ C, 0, 0, 0, 0, 0, 0, 0, 0, 0, 0, 0, 0]->[10, 0, H, Z, Z, Z, Z, Z, Z, Z, H];
[ C, 0, 0, 1, 0, 0, 0, 0, 0, 0, 0, 0, 0]->[14, 0, H, Z, Z, Z, Z, Z, Z, Z, H];
[ C, 0, 0, 1, 0, 0, 0, 0, 0, 0, 0, 0, 0]->[14, 0, L, Z, Z, Z, Z, Z, Z, Z, H];
[ C, 0, 0, 1, 0, 0, 0, 0, 0, 0, 0, 0, 0]->[14, 0, L, Z, Z, Z, Z, Z, Z, Z, H];
[ C, 0, 0, 1, 0, 0, 0, 0, 0, 0, 0, 0, 0]->[14, 0, L, Z, Z, Z, Z, Z, Z, Z, H];
" CHECK SERIAL SHIFT OUT FOR ISPENABLES
[ 0, 1, 1, 1, 0, 0, 0, 0, 0, 0, 0, 0, 0]->[ 0, 0, H, Z, Z, Z, Z, Z, Z, Z, H];
[ C, 0, 1, 1, 0, 0, 0, 0, 0, 0, 0, 0, 0]->[ 1, 0, H, Z, Z, Z, Z, Z, Z, Z, H];
[ C, 0, 1, 0, 0, 0, 0, 0, 0, 0, 0, 0, 0]->[ 2, 0, H, Z, Z, Z, Z, Z, Z, Z, H];
[ C, 0, 1, 0, 0, 0, 0, 0, 0, 0, 0, 0, 0]->[ 3, 0, H, Z, Z, Z, Z, Z, Z, Z, H];
[ C, 0, 1, 0, 0, 0, 0, 0, 0, 0, 0, 0, 0]->[ 4, 0, H, Z, Z, Z, Z, Z, Z, Z, H];
[ C, 0, 1, 0, 0, 0, 0, 0, 0, 0, 0, 0, 0]->[ 5, 0, H, Z, Z, Z, Z, Z, Z, Z, H];
[ C, 0, 1, 0, 0, 0, 0, 0, 0, 0, 0, 0, 0]->[ 6, 0, H, Z, Z, Z, Z, Z, Z, Z, H];
[ C, 0, 1, 1, 0, 0, 0, 0, 0, 0, 0, 0, 0]->[ 7, 0, H, Z, Z, Z, Z, Z, Z, Z, H];
[ C, 0, 0, 0, 0, 0, 0, 0, 0, 0, 0, 0, 0]->[ 8, 0, H, Z, Z, Z, Z, Z, Z, Z, H];
[ C, 0, 1, 0, 0, 0, 0, 0, 0, 0, 0, 0, 0]->[ 9, 0, H, Z, Z, Z, Z, Z, Z, Z, H];
[ C, 0, 0, 0, 0, 0, 0, 0, 0, 0, 0, 0, 0]->[10, 0, H, Z, Z, Z, Z, Z, Z, Z, H];
[ C, 0, 0, 0, 0, 0, 0, 0, 0, 0, 0, 0, 0]->[11, 0, H, Z, Z, Z, Z, Z, Z, Z, H];
[ C, 0, 0, 0, 0, 0, 0,    0, 0, 0, 0, 0]->[11, 1, H,  , Z, Z, Z, Z, Z, Z, H];
[ C, 0, 0, 1, 0, 0, 0, 0, 0, 0, 0, 0, 0]->[13, 1, H, Z, Z, Z, Z, Z, Z, Z, H];
[ C, 0, 0, 1, 0, 1, 0, 0, 0, 0, 0, 0, 0]->[13, 0, H, Z, Z, Z, Z, Z, Z, Z, H];
[ C, 0, 0, 1, 0, 0, 0, 0, 0, 0, 0, 0, 0]->[13, 4, L, Z, Z, Z, Z, Z, Z, Z, H];
[ C, 0, 0, 1, 0, 0, 0, 0, 0, 0, 0, 0, 0]->[13, 2, L, Z, Z, Z, Z, Z, Z, Z, H];
[ C, 0, 0, 1, 0, 0, 0, 0, 0, 0, 0, 0, 0]->[13, 1, L, Z, Z, Z, Z, Z, Z, Z, H];
[ C, 0, 1, 1, 0, 0, 0, 0, 0, 0, 0, 0, 0]->[ 0, 1, H, L, Z, Z, Z, Z, Z, Z, L];

end isphw60 ;

ABEL 4.20  -  Device Utilization Chart

==== F6001 Programmed Logic ====

ST3.D   = (   !MODE & !SDIN & !ISPEN & ST0.Q & ST1.Q & ST2.Q & !ST3.Q
          #    MODE & !SDIN & !ISPEN & !ST0.Q & !ST1.Q & !ST2.Q & ST3.Q
          #   !MODE & !SDIN & !ISPEN & ST0.Q & !ST1.Q & !ST2.Q & ST3.Q
          #   !MODE & !SDIN & !ISPEN & !ST0.Q & ST1.Q & !ST2.Q & ST3.Q
          #   !MODE &  SDIN & !ISPEN & !ST0.Q & !ST1.Q & !ST2.Q & ST3.Q
          #   !MODE &  SDIN & !ISPEN & ST0.Q & !ST1.Q & !ST2.Q & ST3.Q
          #   !MODE &  SDIN & !ISPEN & !ST0.Q & ST1.Q & ST2.Q & ST3.Q
          #   !MODE &  SDIN & !ISPEN & ST0.Q & !ST1.Q & ST2.Q & ST3.Q
          #    MODE & !ISPEN & ST0.Q & ST1.Q & !ST2.Q & ST3.Q
          #   !SDIN & !ISPEN & ST0.Q & ST1.Q & !ST2.Q & ST3.Q );
            " ISTYPE 'BUFFER'
ST3.C   = ( OCLK );

ST2.D   = (   MODE &  SDIN & !ISPEN & !ST0.Q & ST1.Q & ST2.Q & !ST3.Q
          #   MODE & !SDIN & !ISPEN & !ST1.Q & ST2.Q & !ST3.Q
          #  !MODE & !SDIN & !ISPEN & !ST0.Q & ST1.Q & !ST2.Q & ST3.Q
          #   MODE & !SDIN & !ISPEN & ST0.Q & ST1.Q & !ST2.Q
          #  !MODE &  SDIN & !ISPEN & !ST0.Q & ST1.Q & ST2.Q & ST3.Q
          #  !MODE &  SDIN & !ISPEN & ST0.Q & !ST1.Q & ST2.Q & ST3.Q
          #   MODE & !ISPEN & ST0.Q & ST1.Q & ST2.Q & ST3.Q
          #  !SDIN & !ISPEN & ST0.Q & ST1.Q & ST2.Q & ST3.Q );
            " ISTYPE 'BUFFER'
ST2.C   = ( OCLK );

ST1.D   = (   MODE & !SDIN & !ISPEN & !ST0.Q & ST1.Q & !ST2.Q & !ST3.Q
          #   MODE &  SDIN & !ISPEN & !ST0.Q & ST1.Q & ST2.Q & !ST3.Q
          #  !MODE & !SDIN & !ISPEN & ST0.Q & !ST1.Q & !ST2.Q & ST3.Q
          #  !MODE & !SDIN & !ISPEN & !ST0.Q & ST1.Q & ST2.Q & ST3.Q
          #  !MODE &  SDIN & !ISPEN & !ST0.Q & ST1.Q & ST2.Q & ST3.Q
          #   MODE & !SDIN & !ISPEN & ST0.Q & !ST1.Q & !ST3.Q
          #  !MODE &  SDIN & !ISPEN & !ST0.Q & ST1.Q & !ST2.Q & ST3.Q
          #  !MODE &  SDIN & !ISPEN & !ST0.Q & ST1.Q & ST2.Q & ST3.Q );
            " ISTYPE 'BUFFER'
ST1.C   = ( OCLK );
```

```
ST0.D      = ( MODE & !SDIN & !ISPEN & !ST0.Q & !ST1.Q & ST2.Q & !ST3.Q
             # MODE &  SDIN & !ISPEN & !ST0.Q & !ST1.Q & ST2.Q & !ST3.Q
             # MODE & !SDIN & !ISPEN & !ST0.Q &  ST1.Q & !ST2.Q & ST3.Q
             # MODE & !SDIN & !ISPEN & !ST0.Q &  ST1.Q & !ST2.Q & ST3.Q
             # MODE &  SDIN & !ISPEN & !ST0.Q &  ST1.Q & ST2.Q & !ST3.Q
             # !MODE & !SDIN & !ISPEN & !ST0.Q & ST1.Q & !ST2.Q & ST3.Q
             # !MODE & !SDIN & !ISPEN & ST0.Q & ST1.Q & !ST2.Q & ST3.Q
             # !MODE &  SDIN & !ISPEN & ST0.Q & ST1.Q & ST2.Q & ST3.Q
             # !SDIN & !ISPEN & ST0.Q & ST1.Q & !ST2.Q & ST3.Q );
             " ISTYPE 'BUFFER'
ST0.C      = ( OCLK );
T_REG2.D   = ( !MODE & SDIN & !ISPEN & LOOP_IN & SHFT & ST0.Q & !ST1.Q & ST2.Q
               & ST3.Q
             # !MODE & SDIN & !ISPEN & !CAI & SHFT & !ST0.Q & ST1.Q & ST2.Q
               & ST3.Q
             # !ISPEN & CAO & !ST3 & !T_REG2 & !SHFT
             # !ISPEN & CAO & ST2 & !T_REG2 & !SHFT
             # !ISPEN & CAO & !ST1 & !T_REG2 & !SHFT
             # !ISPEN & CAO & ST0 & !T_REG2 & !SHFT ); " ISTYPE 'BUFFER'
T_REG2.C   = ( OCLK );
T_REG2.CE  = ( !MODE & SDIN & !CAI & ST1 & !ST2 & ST3 & T_REG0 & T_REG1
             # !MODE & SDIN & !ISPEN & !ST0.Q & ST1.Q & ST2.Q & ST3.Q
             # !MODE & SDIN & !ISPEN & ST0.Q & ST1.Q & ST2.Q & ST3.Q
             # !ST0 & ST1 & !ST2 & ST3
             # ST0.Q & !ST1.Q & !ST2.Q & ST3.Q
             # ISPEN );

T_REG1.D   = ( !MODE & SDIN & !ISPEN & SHFT & ST0.Q & !ST1.Q & ST2.Q & ST3.Q
               & T_REG2.Q
             # !MODE & SDIN & !ISPEN & SHFT & !ST0.Q & ST1.Q & ST2.Q & ST3.Q
               & T_REG2.Q
             # !ISPEN & CAO & !ST3 & !T_REG1 & !SHFT
             # !ISPEN & CAO & ST2 & !T_REG1 & !SHFT
             # !ISPEN & CAO & !ST1 & !T_REG1 & !SHFT
             # !ISPEN & CAO & ST0 & !T_REG1 & !SHFT ); " ISTYPE 'BUFFER'
T_REG1.C   = ( OCLK );
T_REG1.CE  = ( !MODE & SDIN & !CAI & ST1 & !ST2 & ST3 & T_REG0
             # !MODE & SDIN & !ISPEN & !ST0.Q & ST1.Q & ST2.Q & ST3.Q
             # !MODE & SDIN & !ISPEN & ST0.Q & ST1.Q & ST2.Q & ST3.Q
             # !ST0 & ST1 & !ST2 & ST3
             # ST0.Q & !ST1.Q & !ST2.Q & ST3.Q
             # ISPEN );

T_REG0.D   = ( !MODE & SDIN & !ISPEN & SHFT & ST0.Q & !ST1.Q & ST2.Q & ST3.Q
               & T_REG1.Q
             # !MODE & SDIN & !ISPEN & SHFT & !ST0.Q & ST1.Q & ST2.Q & ST3.Q
               & T_REG1.Q
             # !ISPEN & CAO & !ST3 & !T_REG0 & !SHFT
             # !ISPEN & CAO & ST2 & !T_REG0 & !SHFT
             # !ISPEN & CAO & !ST1 & !T_REG0 & !SHFT
             # !ISPEN & CAO & ST0 & !T_REG0 & !SHFT ); " ISTYPE 'BUFFER'
T_REG0.C   = ( OCLK );
T_REG0.CE  = ( !MODE & SDIN & !CAI & ST1 & !ST2 & ST3
             # !MODE & SDIN & !ISPEN & !ST0.Q & ST1.Q & ST2.Q & ST3.Q
             # !MODE & SDIN & !ISPEN & ST0.Q & ST1.Q & ST2.Q & ST3.Q
             # !ST0 & ST1 & !ST2 & ST3
             # ST0.Q & !ST1.Q & !ST2.Q & ST3.Q
             # ISPEN );

CAO.D      = !( !MODE & SDIN & !ISPEN & T_REG0 & T_REG1 & T_REG2 & ST0.Q & ST1.Q
               & !ST2.Q & ST3.Q
             # !MODE & SDIN & !ISPEN & SHFT & ST0.Q & !ST1.Q & ST2.Q & ST3.Q
               & !T_REG0.Q
             # !MODE & SDIN & !ISPEN & SHFT & !ST0.Q & ST1.Q & ST2.Q & ST3.Q
               & !T_REG0.Q ); " ISTYPE 'INVERT'
CAO.C      = ( OCLK );
CAO.AR     = ( ISPEN );
CAO.CE     = ( !MODE & SDIN & !ISPEN & T_REG0 & T_REG1 & T_REG2 & ST0.Q & ST1.Q
               & !ST2.Q & ST3.Q
             # !MODE & SDIN & !ISPEN & !ST0.Q & ST1.Q & ST2.Q & ST3.Q
             # !MODE & SDIN & !ISPEN & ST0.Q & ST1.Q & ST2.Q & ST3.Q
             # ST0.Q & !ST1.Q & !ST2.Q & ST3.Q );

PROGEN.D   = !( !MODE & SDIN & !ISPEN & ST0.Q & !ST1.Q & ST2.Q & ST3.Q
```

```
              #     !CAO & !ST0.Q
              #     ISPEN & ST0.Q
              #     !SDIN & ST0.Q
              #     !ST3.Q
              #     !ST2.Q
              #     ST1.Q ); " ISTYPE 'INVERT'
PROGEN.C    = ( OCLK );
PROGEN.CE   = ( ST0.Q & !ST1.Q & !ST2.Q & ST3.Q
              #    !ST1.Q & ST2.Q & ST3.Q );

LOOP_IN.OE  = (0);

ISPEN0      = !( !M_ISP0 );
ISPEN0.OE   = ( !ISPEN & T_REG0 & !T_REG1 & !T_REG2 & !PROGEN.FB );

ISPEN1      = !( !M_ISP1 );
ISPEN1.OE   = ( !ISPEN & !T_REG0 & T_REG1 & !T_REG2 & !PROGEN.FB );

ISPEN2      = !( !M_ISP2 );
ISPEN2.OE   = ( !ISPEN & T_REG0 & T_REG1 & !T_REG2 & !PROGEN.FB );

ISPEN3      = !( !M_ISP3 );
ISPEN3.OE   = ( !ISPEN & !T_REG0 & !T_REG1 & T_REG2 & !PROGEN.FB );

ISPEN4      = !( !M_ISP4 );
ISPEN4.OE   = ( !ISPEN & T_REG0 & !T_REG1 & T_REG2 & !PROGEN.FB );

ISPEN5      = !( !M_ISP5 );
ISPEN5.OE   = ( !ISPEN & !T_REG0 & T_REG1 & T_REG2 & !PROGEN.FB );

ISPEN6      = !( !M_ISP6 );
ISPEN6.OE   = ( !ISPEN & T_REG0 & T_REG1 & T_REG2 & !PROGEN.FB );

SHFT.D      = ( !MODE & SDIN & !ISPEN & !ST0.Q & ST1.Q & !ST2.Q & ST3.Q
              #  !MODE & SDIN & !ISPEN & ST0.Q & !ST1.Q & ST2.Q & ST3.Q
              #  !SDIN & !ISPEN & ST0.Q & ST1.Q & !ST2.Q & ST3.Q );
              " ISTYPE 'BUFFER'
SHFT.CE     = ( ST0.Q & !ST1.Q & ST2.Q & ST3.Q
              #  ST1.Q & !ST2.Q & ST3.Q
              #  !ST0.Q & ST1.Q & ST3.Q );

Warning 5087: Mapping ST0 to ST0.FB; only one fb is allowed on pin 26
Warning 5087: Mapping ST1 to ST1.FB; only one fb is allowed on pin 27
Warning 5087: Mapping ST2 to ST2.FB; only one fb is allowed on pin 28
Warning 5087: Mapping ST3 to ST3.FB; only one fb is allowed on pin 29
Warning 5087: Mapping T_REG0 to T_REG0.FB; only one fb is allowed on pin 31
Warning 5087: Mapping T_REG1 to T_REG1.FB; only one fb is allowed on pin 32
Warning 5087: Mapping T_REG2 to T_REG2.FB; only one fb is allowed on pin 33
```

===== F6001 Chip Diagram =====

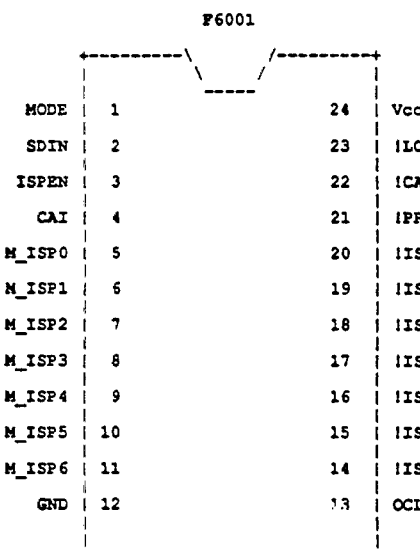

SIGNATURE: N/A

*
QP24* QF8294* QV102* F0*
X0*
NOTE Table of pin names and numbers*
NOTE PINS OCLK:13 MODE:1 SDIN:2 ISPEN:3 CAI:4 M_ISP0:5 M_ISP1:6 M_ISP2:7*
NOTE PINS M_ISP3:8 M_ISP4:9 M_ISP5:10 M_ISP6:11 LOOP_IN:23 ISPEN0:14 ISPEN1:15*
NOTE PINS ISPEN2:16 ISPEN3:17 ISPEN4:18 ISPEN5:19 ISPEN6:20 PROGEN:21 CAO:22*
NOTE Table of node names and numbers*
NOTE NODES ST0:26 ST1:27 ST2:28 ST3:29 T_REG0:31 T_REG1:32 T_REG2:33*
NOTE NODES SHFT:30*
L0000 100110111111111111110101100111010101111111111111111111111111111111
11111111111111111111001111111111111111*
L0114 100111011111111111111101100111010111111111111111111111111111111111
11111111111111111111101111111111111111*
L0228 100110111111111111111101100101011011111111111111111111111111111111
11111111111111111111101111111111111111*
L0342 100110111111111111111100101010110111111111111111111111111111111111
11111111111111111111101111111111111111*
L0456 100110111111111111111101100101011111101111111111111111111111111111
11111111111111111111110111111111111111*
L0570 100110111111111111111101100101011011111111111111111111111111111111
11111111111111111111111101111111111111*
L0684 100110111111111111111101100101011110111111111111111111111111111111
11111111111111111111110111111111111111*
L0798 100110111111111111111100101010110111111111111111111111111111111111
11111111111111111111111011111111111111*
L0912 100110111111111111111100101010111101111111111111111111111111111111
11111111111111111111110111111111111111*
L1026 100110101111111111111100101010111111111111111111111111111111111111
11111111111111111111110111111111111111*
L1140 100111011111111111111110110011101111111111111111111111111111111111
111111111111111111111110111111111111111*
L1254 011010111111111111111110100110111111111111111111111111111111111111
11111111111111111111111111111111111101*
L1368 100111011111111111111111011001111111111111111111111111111111111111
11111111111111111111111111101111111111*
L1482 010110111111111111111110101010111111111111111111111111111111111111
11111111111111111111111111111111111101*
L1596 011010111111111111111111001101011111111111111111111111111111111111
11111111111111111111111111111110101*
L1710 101010111111111111111110101011011111111111111111111111111111111111
11111111111111111111111111111101111111*
L1824 011010111111111111111110101001111111111111111111111111111111111111
11111111111111111111111111101111101*
L1938 010110111111111111111100101101111111111111111111111111111111111111
11111111111111111111111111111110101*
L2052 101010111111111111111101010011111111111111111111111111111111111111
11111111111111111111111111101110111*
L2166 101010111111111111111110011001111111111111111111111111111111111111
11111111111111111111111111101110101*
L2280 011010111111111111111110011011111111111111111111111111111111111111
11111111111111111111111111111011111*
L2394 100110111111111111111100110011111111111111111111111111111111111111
11111111111111111111111110101010111*
L2508 011010111111111111111110110110111111111111111111111111111111111111
11111111111111111111111111111110111*
L2622 100110111111111111111101011001111111111111111111111111111111111111
11111111111111111111111111101110101*
L2736 011010111111111111111110101101011111111111111111111111111111111111
111111111111111111111111111011111*
L2850 100110111111111111111110010101111111111111111111111111111111111111
1111111111111111111101101010101010111*
L2964 100110111111111111111101100101111111111111111111111111111111111111
11111111111111011011010100101011101*
L3078 011110111111111111111110101100111111111111111111111111111111111111
11111111111111111111111111101011111*
L3192 111110111111111111111111101010111101111111111111111111111111111111
111111111111111111111111011111111111*
L3306 111110111111111111111111011011101011110111111111111111111111111111
1111111111111111111111110111111111*
L3420 111110111111111111111110111101011110111111111111111111111111111111
111111111111111111111111110111111111*

```
L3534 11111011111111111111111101111111110101111101111111111111111111111111111
       11111111111111111111111011111111111*
L3648 11111011111111111111111111101011101110111111111111111111111111111111111
       1111111111111111111111110111111111111*
L3762 11111011111111111111111110111101110111011111111111111111111111111111111
       111111111111111111111110111111111111*
L3876 11111011111111111111111110111101110111011111111111111111111111111111111
       111111111111111111111110111111111111*
L3990 11111011111111111111110111111110111011101111111111111111111111111111111
       111111111111111111111110111111111111*
L4104 11111011111111111111111111101011110110111111111111111111111111111111111
       1111111111111111110111111111111*
L4218 11111011111111111111110111011110110111111111111111111111111111111111111
       1111111111111111110111111111111111*
L4332 11111011111111111111111101111011110110111111111111111111111111111111111
       111111111111111111110111111111111111*
L4446 11111011111111111111110111111011110110111111111111111111111111111111111
       111111111111111111110111111111111*
L4560 11101011111111111111101011001111111111111111111111111111111111111111111
       1111111111111111111111111110101011101*
L4674 11111111111111111111111001100111111111111111111111111111111111111111111
       111111111111111111111010111111111*
L4788 11111111111111111101100101111111111111111111111111111111111111111111111
       1111111111111111111111111111011111111*
L4902 11111111111111111111101101001111111111111111111111111111111111111111111
       11111111111111101011101010111111111*
L5016 11111111111111111111111110010111111111111111111111111111111111111111111
       111111111111111011111111111111111111*
L5130 11111111111111111111111111011001111111111111111111111111111111111111111
       11111111111111111111111111011111111*
L5244 11111111111111111111111110011011111111111111111111111111111111111111111
       11111111111111111111111011111111*
L5358 11111111111111111111111110111111111111111011111111111111111111111111111
       11111111111111011111111111111111111*
L5472 11110111111111111111110111111111111111111111111111111111111111111111111
       111111111111111101111111111111111111*
L5586 11101111111111111111101111111111111111111111111111111111111111111111111
       11111111111111101111111111111111111*
L5700 11111111101111111111111111111111111111111111111111111111111111111111111
       1111011111111111111111111111111111*
L5814 11111111111011111111111111111111111111111111111111111111111111111111111
       11111101111111111111111111111111*
L5928 11111111111101111111111111111111111111111111111111111111111111111111111
       11111110111111111111111111111111*
L6042 11111111111111101111111111111111111111111111111111111111111111111111111
       11111111101111111111111111111111*
L6156 11111111111111110111111111111111111111111111111111111111111111111111111
       1111111110111111111111111111111*
L6270 11111111111111111101111111111111111111111111111111111111111111111111111
       111111111110111111111111111111111*
L6384 11111111111111111110111111111111111111111111111111111111111111111111111
       111111111111101111111111111111111111*
L6498 11111111111111111111101111111111111111111111111111111111111111111111111
       11111111111111101111111111111111111*
L6612 11110111111111111111111111111111111111111111111111111111111111111111111
       111111111111111111110101011111111111*
L6726 11111111111111111111111011111111111111111111111111111111111111111111111
       1111111111111101111111111111111111*
L6840 11111111111111111111110111111111111111111111111111111111111111111111111
       111111111111110111111111111111111*
L6954 00000000000000000000000000000000000000000000000000000000000000000000000
       00001111111111111111111111111111*
L7068 00000000000000000000000000000000000000000000000000000000000000000000000
       000011111111111111111111111111111*
L7182 00000000000000000000000000000000000000000000000000000000000000000000000
       00001111111111111111111111111111*
L7374 11111111111111111111111111111111111111111111111111111111111111111111111
       1111*
L7452 11111111111111111111111111111111111111111111111111111111111111111111111
       1111*
L7530 11110111111111111111111111010101111111111111111111111111111111111111101
       1111*
```

```
L7608 111110111111111111111111111111111001011111111111111111111111111111101
1111*
L7686 111110111111111111111111111111111011001111111111111111111111111111101
1111*
L7764 111110111111111111111111111111111010011111111111111111111111111111101
1111*
L7842 111110111111111111111111111111111010110111111111111111111111111111101
1111*
L7920 111110111111111111111111111111111001101111111111111111111111111111101
1111*
L7998 111110111111111111111111111111111011010111111111111111111111111111101
1111*
L8076 111101111111111111111111111111111111111111111111111111111111111111111
1111*
L8154 101*
L8157 101*
L8160 101*
L8163 101*
L8166 100*
L8169 100*
L8172 100*
L8175 100*
L8178 0100*
L8182 0100*
L8186 0100*
L8190 0100*
L8194 0100*
L8198 0100*
L8202 0100*
L8206 1001*
L8210 1000*
L8218 1111*
V0001 00100000000NOZZZZZZZHHON*
V0002 11000000000NCZZZZZZZHHON*
V0003 10000000000NCZZZZZZZHHON*
V0004 10000000000NCZZZZZZZHHON*
V0005 10000000000NCZZZZZZZHHON*
V0006 10000000000NCZZZZZZZHHON*
V0007 10000000000NCZZZZZZZHHON*
V0008 11000000000NCZZZZZZZHHON*
V0009 00000000000NCZZZZZZZHHON*
V0010 10000000000NCZZZZZZZHHON*
V0011 00000000000NCZZZZZZZHHON*
V0012 01000000000NCZZZZZZZHHON*
V0013 01000000000NCZZZZZZZHHON*
V0014 11000000000NCZZZZZZZHHON*
V0015 01000000000NCLZZZZZZLHON*
V0016 11000000000NCLZZZZZZLHON*
V0017 10000000000NCLZZZZZZLHON*
V0018 10000000000NCLZZZZZZLHON*
V0019 10000000000NCLZZZZZZLHON*
V0020 10000000000NCLZZZZZZLHON*
V0021 10000000000NCLZZZZZZLHON*
V0022 11000000000NCLZZZZZZLHON*
V0023 00000000000NCLZZZZZZLHON*
V0024 10000000000NCLZZZZZZLHON*
V0025 00000000000NCZZZZZZZHHON*
V0026 01000000000NCZZZZZZZHHON*
V0027 01000000000NCZZZZZZZHHON*
V0028 01000000000NCZZZZZZZHHON*
V0029 01000000000NCZZZZZZZHHON*
V0030 01000000000NCZZZZZZZHHON*
V0031 01000000000NCZZZZZZZHHON*
V0032 01000000000NCZZZZZZZHHON*
V0033 01000000000NCZZZZZZZHHON*
V0034 01000000000NCZZZZZZZHLON*
V0035 11000000000NCZZZZZZZHLON*
V0036 01000000000NCZZZZZZZHLON*
V0037 11000000000NCZZZZZZZHLON*
V0038 10000000000NCZZZZZZZHLON*
V0039 10000000000NCZZZZZZZHLON*
V0040 10000000000NCZZZZZZZHLON*
```

```
V0041 10000000000NCZZZZZZZHLON*
V0042 10000000000NCZZZZZZZHLON*
V0043 11000000000NCZZZZZZZHLON*
V0044 00000000000NCZZZZZZZHLON*
V0045 10000000000NCZZZZZZZHLON*
V0046 00000000000NCZZZZZZZHHON*
V0047 01000000000NCZZZZZZZHHON*
V0048 01000000000NCZZZZZZZHHON*
V0049 01000000000NCZZZZZZZHHON*
V0050 01000000000NCZZZZZZZHHON*
V0051 01000000000NCZZZZZZZHHON*
V0052 01000000000NCZZZZZZZHHON*
V0053 01000000000NCZZZZZZZHHON*
V0054 01000000000NCZZZZZZZHHON*
V0055 11000000000NCZZZZZZZHHON*
V0056 01000000000NCZZZZZZZLLHON*
V0057 11000000000NCZZZZZZZLLHON*
V0058 10000000000NCZZZZZZZLLHON*
V0059 10000000000NCZZZZZZZLLHON*
V0060 10000000000NCZZZZZZZLLHON*
V0061 10000000000NCZZZZZZZLLHON*
V0062 10000000000NCZZZZZZZLLHON*
V0063 11000000000NCZZZZZZZLLHON*
V0064 00000000000NCZZZZZZZLLHON*
V0065 10000000000NCZZZZZZZLLHON*
V0066 00000000000NCZZZZZZZHHON*
V0067 11100000000NOZZZZZZZHHON*
V0068 11100000000NOZZZZZZZHHON*
V0069 11000000000NCZZZZZZZHHON*
V0070 10000000000NCZZZZZZZHHON*
V0071 10000000000NCZZZZZZZHHON*
V0072 10000000000NCZZZZZZZHHON*
V0073 10000000000NCZZZZZZZHHON*
V0074 10000000000NCZZZZZZZHHON*
V0075 11000000000NCZZZZZZZHHON*
V0076 00000000000NCZZZZZZZHHON*
V0077 10000000000NCZZZZZZZHHON*
V0078 00000000000NCZZZZZZZHHON*
V0079 01000000000NCZZZZZZZHHON*
V0080 01000000000NCZZZZZZZHLON*
V0081 01000000000NCZZZZZZZHLON*
V0082 01000000000NCZZZZZZZHLON*
V0083 01000000000NCZZZZZZZHLON*
V0084 11100000000NOZZZZZZZHHON*
V0085 11000000000NCZZZZZZZHHON*
V0086 10000000000NCZZZZZZZHHON*
V0087 10000000000NCZZZZZZZHHON*
V0088 10000000000NCZZZZZZZHHON*
V0089 10000000000NCZZZZZZZHHON*
V0090 10000000000NCZZZZZZZHHON*
V0091 11000000000NCZZZZZZZHHON*
V0092 00000000000NCZZZZZZZHHON*
V0093 10000000000NCZZZZZZZHHON*
V0094 00000000000NCZZZZZZZHHON*
V0095 00000000000NCZZZZZZZHHON*
V0096 00000000000NCZZZZZZZHHON*
V0097 01000000000NCZZZZZZZHHON*
V0098 01000000000NCZZZZZZZHH1N*
V0099 01000000000NCZZZZZZZHLON*
V0100 01000000000NCZZZZZZZHLON*
V0101 01000000000NCZZZZZZZHLON*
V0102 11000000000NCLZZZZZZLHON*
CA001*
5344
```

THE WIRING OF GAL 6001 AS A STATE MACHINE CONTROLLED DEMULTIPLEXOR AND CASCADING OF 2 GAL 6001 FOR PROGRAMMING MORE THAN 7 ISP DEVICES.

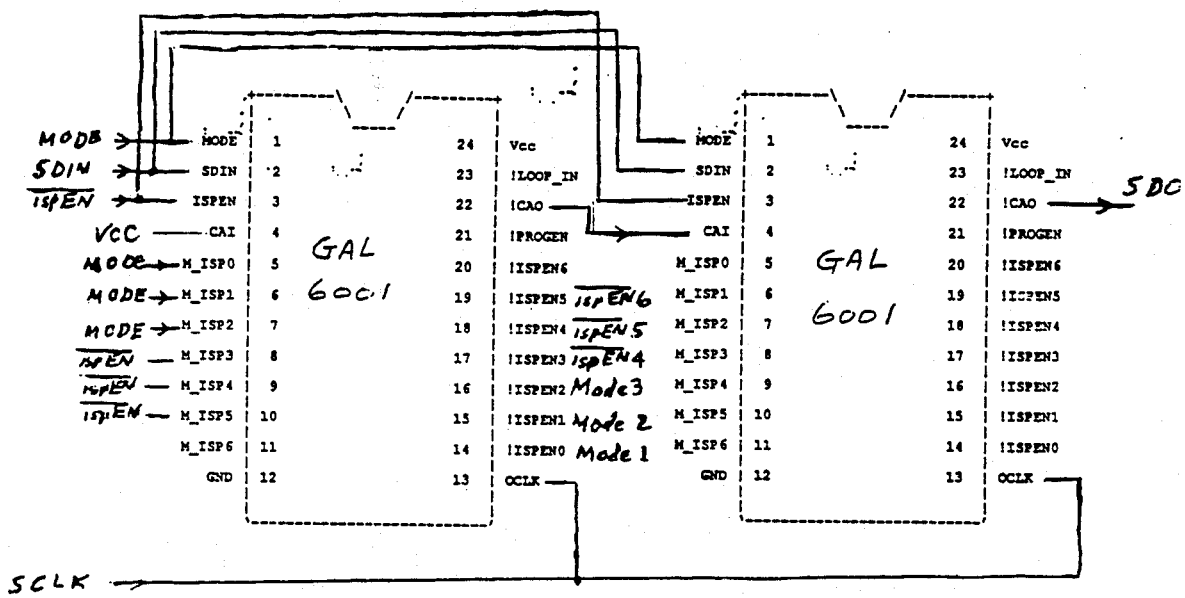

We claim:

1. An arrangement for programming a plurality of programmable logic devices comprising:
   a programming command generator;
   a plurality of programmable logic devices; and
   a device selector for forming a connection between individual ones of said programmable logic devices and said programming command generator so as to allow said individual ones of said logic devices to be programmed by said programming command generator;
   wherein said device selector comprises a state machine-controlled demultiplexor.

2. An arrangement for programming a plurality of programmable logic devices comprising:
   a programming command generator;
   a plurality of programmable logic devices; and
   a device selector for forming a connection between individual ones of said programmable logic devices and said programming command generator so as to allow said individual ones of said logic devices to be programmed by said programming command generator;
   wherein said device selector comprises a switch matrix.

3. An arrangement for programming a plurality of programmable logic devices comprising:
   a programming command generator;
   a plurality of programmable logic devices; and
   a device selector for forming a connection between individual ones of said programmable logic devices and said programming command generator so as to allow said individual ones of said logic devices to be programmed by said programming command generator;
   wherein said device selector comprises a state machine-controlled matrix.

4. An arrangement for programming a plurality of programmable logic devices comprising:
   a programming command generator; and
   a plurality of programmable logic devices, said programmable logic devices being connected in parallel to said programming command generator such that said programming command generator may transmit a programming command to any one of said logic devices without having said command pass through any of the other of said logic devices, said programming command generator being capable of transmitting a programming command to more than one of said logic devices simultaneously.

5. A method of programming a plurality of programmable logic devices with a programming command generator, said method comprising the steps of:
   transmitting an identification code to said programmable logic devices, the receipt of said identification code causing only one of said devices to be placed in a condition to receive programming data from said programming command generator; and
   causing said programming command generator to transmit programming data to said device.

6. The method of claim 5 comprising the additional step of causing said device to execute programmable connections in accordance with said programming data.

* * * * *

UNITED STATES PATENT AND TRADEMARK OFFICE
CERTIFICATE OF CORRECTION

PATENT NO.   :   5,329,179
DATED        :   July 12, 1994
INVENTOR(S)  :   Tang et al.

It is certified that error appears in the above-identified patent and that said Letters Patent is hereby corrected as shown below:

Col. 1, line 21, after "ISP" insert --devices--;

Col. 1, line 25, after "07/695,356" insert --now U.S. Patent No. 5,237,218, issued August 17, 1993,--;

Col. 3, line 4, insert a space between "ispEN" and output;

Col. 4, line 60, insert a space between "$\overline{ispEN}$" and "output";

Col. 4, line 64, insert a space between "$\overline{ispEN}$" and "pin";

Col. 5, line 2, insert a space between "$\overline{ispEN}$" and "output";

Col. 6, line 52, insert a space between "$\overline{ispEN}$" and "to";

Col. 7, line 7, insert a space between "$\overline{ispEN}$" and "low";

Col. 15 - Appendix B, The line after "STATE 13: CAO.CE=(!MODE&SDIN&!ISPEN);" should read --PROGEN.CE=1;--;

Cols. 17 & 18, line 29, fill in the first blank with --O--; fill in the second blank with --Z--; and

UNITED STATES PATENT AND TRADEMARK OFFICE
CERTIFICATE OF CORRECTION

PATENT NO. : 5,329,179
DATED : July 12, 1994
INVENTOR(S) : Tang, et al.

It is certified that error appears in the above-indentified patent and that said Letters Patent is hereby corrected as shown below:

Cols. 19 & 20, line 20, fill in the first blank with --O--; fill in the second blank with --Z--.

Signed and Sealed this

Eighteenth Day of April, 1995

Attest:

BRUCE LEHMAN

Attesting Officer

Commissioner of Patents and Trademarks